US012796335B2

(12) United States Patent
Hashemi et al.

(10) Patent No.: US 12,796,335 B2
(45) Date of Patent: Nov. 10, 2026

(54) PERPENDICULAR SPIN-ORBIT TORQUE MAGNETIC RANDOM ACCESS MEMORY

(71) Applicant: International Business Machines Corporation, Armonk, NY (US)

(72) Inventors: Pouya Hashemi, Purchase, NY (US); Jonathan Zanhong Sun, Shrub Oak, NY (US); Daniel Worledge, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 455 days.

(21) Appl. No.: 18/584,342

(22) Filed: Feb. 22, 2024

(65) Prior Publication Data

US 2025/0275483 A1 Aug. 28, 2025

(51) Int. Cl.
*H10N 50/20* (2023.01)
*H10B 61/00* (2023.01)
*H10N 50/01* (2023.01)
*H10N 50/80* (2023.01)

(52) U.S. Cl.
CPC ............. *H10N 50/20* (2023.02); *H10B 61/00* (2023.02); *H10N 50/01* (2023.02); *H10N 50/80* (2023.02)

(58) Field of Classification Search
CPC ........ H10N 50/20; H10N 50/80; H10N 50/01; H10B 61/00
See application file for complete search history.

(56) References Cited

U.S. PATENT DOCUMENTS

| | | | |
|---|---|---|---|
| 10,756,259 | B2 | 8/2020 | Ahn et al. |
| 10,777,247 | B1 | 9/2020 | Sun |
| 11,257,613 | B2 | 2/2022 | Oguz et al. |
| 11,283,010 | B2 | 3/2022 | Vasquez et al. |
| 11,522,009 | B2 | 12/2022 | Gallagher et al. |
| 11,793,085 | B2 | 10/2023 | Crotti et al. |

(Continued)

FOREIGN PATENT DOCUMENTS

CN 115274763 A 11/2022

OTHER PUBLICATIONS

U.S. Appl. No. 17/953,800 entitled, "MRAM Structure With Chiral Spin-Orbit-Torque Metal Electrode", filed Sep. 27, 2022, First Named Inventor: Pouya Hashemi, 37 pages.

(Continued)

*Primary Examiner* — Christine A Enad
(74) *Attorney, Agent, or Firm* — Scully, Scott, Murphy & Presser, P.C.; Kristofer Haggerty

(57) ABSTRACT

A SOT MRAM structure having a perpendicular magnetic free layer magnetization is provided The structure includes a spin conductor charge insulator layer having a horizontal portion and a vertical portion, and a spin conductor layer contacting the horizontal portion of the spin conductor charge insulator layer, and a first sidewall of the vertical portion of the spin conductor charge insulator layer. The structure further includes a MTJ structure having a magnetic free layer in direct physical contact with the spin conductor layer, a MTJ cap, a MRAM electrode-containing hard mask, and an I-shaped SOT channel located on a second sidewall of the vertical portion of the spin conductor charge insulator layer. The structure further includes a dielectric pillar located adjacent to, and in direct contact with, the I-shaped SOT channel.

20 Claims, 24 Drawing Sheets

(56) References Cited

U.S. PATENT DOCUMENTS

| | | | | |
|---|---|---|---|---|
| 11,805,705 | B2 | 10/2023 | Lin et al. | |
| 2020/0083429 | A1* | 3/2020 | Lee | H10N 50/01 |
| 2020/0161542 | A1* | 5/2020 | Ahn | H01F 10/329 |
| 2022/0102426 | A1* | 3/2022 | Lee | H10B 61/00 |
| 2022/0130441 | A1* | 4/2022 | Houssameddine | G11C 11/161 |
| 2022/0406841 | A1* | 12/2022 | Marchack | H10N 50/80 |
| 2024/0112712 | A1* | 4/2024 | Hashemi | G11C 11/02 |

OTHER PUBLICATIONS

U.S. Appl. No. 18/126,127 entitled, "Chiral Spin-Current Supply Structure for MTJ-Based Memory", filed Mar. 24, 2023, First Named Inventor: Jonathan Zanhong Sun, 31 pages.

De Orio, R., et al., "Switching Speedup of the Magnetic Free Layer of Advanced SOT-MRAM", ESSDERC 2019—49th European Solid-State Device Research Conference (ESSDERC), Date of Conference: Sep. 23-26, 2019, 4 pages.

Hu, G., et al., "2X Reduction of STT-MRAM switching current using double spin-torque magnetic tunnel junction", 2021 IEEE International Electron Devices Meeting (IEDM) Date of Conference: Dec. 11-16, 2021, 4 pages.

Sato, N., et al., "Two-terminal spin-orbit torque magnetoresistive random access memory", Nature Electronics, Sep. 2018, pp. 508-511, vol. 1.

* cited by examiner

PERPENDICULAR SPIN-ORBIT TORQUE MAGNETIC RANDOM ACCESS MEMORY

BACKGROUND

The present application relates to a memory structure, and more particularly to a spin-orbit torque magnetic random access memory (SOT MRAM) structure with a perpendicular magnetic free layer magnetization.

There is a need for further reduction of write current in a magnetic tunnel junction (MTJ) used in spin-transfer torque magnetic random access memories (STT-MRAM), especially for applications in embedded memory technology requiring sub 10 ns switching. Since a device physics imposed minimum switching spin-current exists that is today practically on the order of 30-60 μA for approximately 10 ns speed switching in charge current unit, for further reduction of switching charge-current, better conversion to perpendicularly polarized spin-current from a charge current structure is necessary.

Spin-orbit torque (SOT) related charge-to-spin current conversion has shown feasibility for large charge to spin current conversion efficiency. However, most materials' interface-crossing spin-current from spin-orbit action limits the spin-polarization in the plane of the interface the spin-current crosses. For most efficient spin-current driven magnetic switching utilizing the so-called "anti-damping" switching, it is desirable to have the spin-current polarization in the direction of the easy-axis for the switching magnet's moment. Since high density STT-MRAMs utilize MTJs with perpendicularly magnetized free layer (FL) moment, it is incompatible with an SOT-generated spin current whose polarization lies in the film-plane, making SOT generated spin-current difficult to use for STT-MRAM technology. Further, it is necessary to have high spin conductance between an SOT conductor and that of the ferromagnet one desires to switch, which often requires direct high quality interface contact between the SOT conductor and the ferromagnet that forms the magnetic free layer of the MTJ structure. When both are good electrical conductors, this could cause sizable charge current shunting, reducing the net charge-to-spin current conversion efficiency from the SOT.

SUMMARY

A SOT MRAM structure is provided that includes a unique sidewall SOT structure that enables perpendicular magnetic free layer magnetization.

In one aspect of the present application, a SOT MRAM structure with perpendicular magnetic free layer magnetization is provided. In one embodiment of the present application, the SOT MRAM structure includes a spin conductor charge insulator layer having a horizontal portion and a vertical portion, and a spin conductor layer contacting the horizontal portion of the spin conductor charge insulator layer and a first sidewall of the vertical portion of the spin conductor charge insulator layer. The SOT MRAM structure further includes a MTJ structure including a magnetic free layer, a magnetic tunnel barrier layer, and a magnetic reference layer in which the magnetic free layer is in direct physical contact with the spin conductor layer. The SOT MRAM structure further includes a MTJ cap contacting the MTJ structure, a MRAM electrode-containing hard mask contacting the MTJ cap and an I-shaped SOT channel located on a second sidewall of the vertical portion of the spin conductor charge insulator layer and having a bottommost surface that is vertically offset from a bottommost surface of the spin conductor charge insulator layer, the second sidewall is opposite the first sidewall. In the SOT MRAM structure, an interface between each of the spin conductor charge insulator layer, the spin conductor layer, the I-shaped SOT channel, the MTJ structure and the MTJ cap is a pure material interface. The SOT MRAM structure further includes a dielectric pillar located adjacent to, and in direct contact with, the I-shaped SOT channel.

In another aspect of the present application, a memory structure is provided that includes a first SOT MRAM and a second SOT MRAM, each of the first SOT MRAM and the second SOT MRAM includes a spin conductor charge insulator layer having a horizontal portion and a vertical portion, a spin conductor layer contacting the horizontal portion of the spin conductor charge insulator layer and a first sidewall of the vertical portion of the spin conductor charge insulator layer, a MTJ structure including a magnetic free layer, a magnetic tunnel barrier layer, and a magnetic reference layer in which the magnetic free layer is in direct physical contact with the spin conductor layer, a MTJ cap contacting the MTJ structure, a MRAM electrode-containing hard mask contacting the MTJ cap, and an I-shaped SOT channel located on a second sidewall of the vertical portion of the spin conductor charge insulator layer and having a bottommost surface that is vertically offset from a bottommost surface of the spin conductor charge insulator layer, wherein the second sidewall is opposite the first sidewall, and a dielectric pillar located adjacent to, and in direct contact with, the I-shaped SOT channel. In the memory structure, an interface between each of the spin conductor charge insulator layer, the spin conductor layer, the I-shaped SOT channel, the MTJ structure and the MTJ cap is a pure material interface. The memory structure further includes a metal shunting structure contacting a topmost surface of the I-shaped SOT channel of both the first SOT MRAM and the second SOT MRAM, and located on top of the dielectric pillar.

In another aspect of the present application a memory structure is provided that includes a first SOT MRAM and a second SOT MRAM, each of the first SOT MRAM and the second SOT MRAM includes a spin conductor charge insulator layer having a horizontal portion and a vertical portion, a spin conductor layer contacting the horizontal portion of the spin conductor charge insulator layer and a first sidewall of the vertical portion of the spin conductor charge insulator layer, a MTJ structure including a magnetic free layer, a magnetic tunnel barrier layer, and a magnetic reference layer in which the magnetic free layer is in direct physical contact with the spin conductor layer, a MTJ cap contacting the MTJ structure, a MRAM electrode-containing hard mask contacting the MTJ cap, and an I-shaped SOT channel located on a second sidewall of the vertical portion of the spin conductor charge insulator layer and having a bottommost surface that is vertically offset from a bottommost surface of the spin conductor charge insulator layer, wherein the second sidewall is opposite the first sidewall, and a dielectric pillar located adjacent to, and in direct contact with, the I-shaped SOT channel. In the memory structure, an interface between each of the spin conductor charge insulator layer, the spin conductor layer, the I-shaped SOT channel, the MTJ structure and the MTJ cap is a pure material interface. The memory structure can further include a first metal shunting structure contacting a topmost surface of the I-shaped SOT channel of the first SOT MRAM, a second metal shunting structure contacting a topmost surface of the I-shaped SOT channel of the second SOT MRAM, and a cell separating dielectric separating the first metal shunting structure from the second metal shunting structure and located above the dielectric pillar.

DETAILED DESCRIPTION

Figure 1:
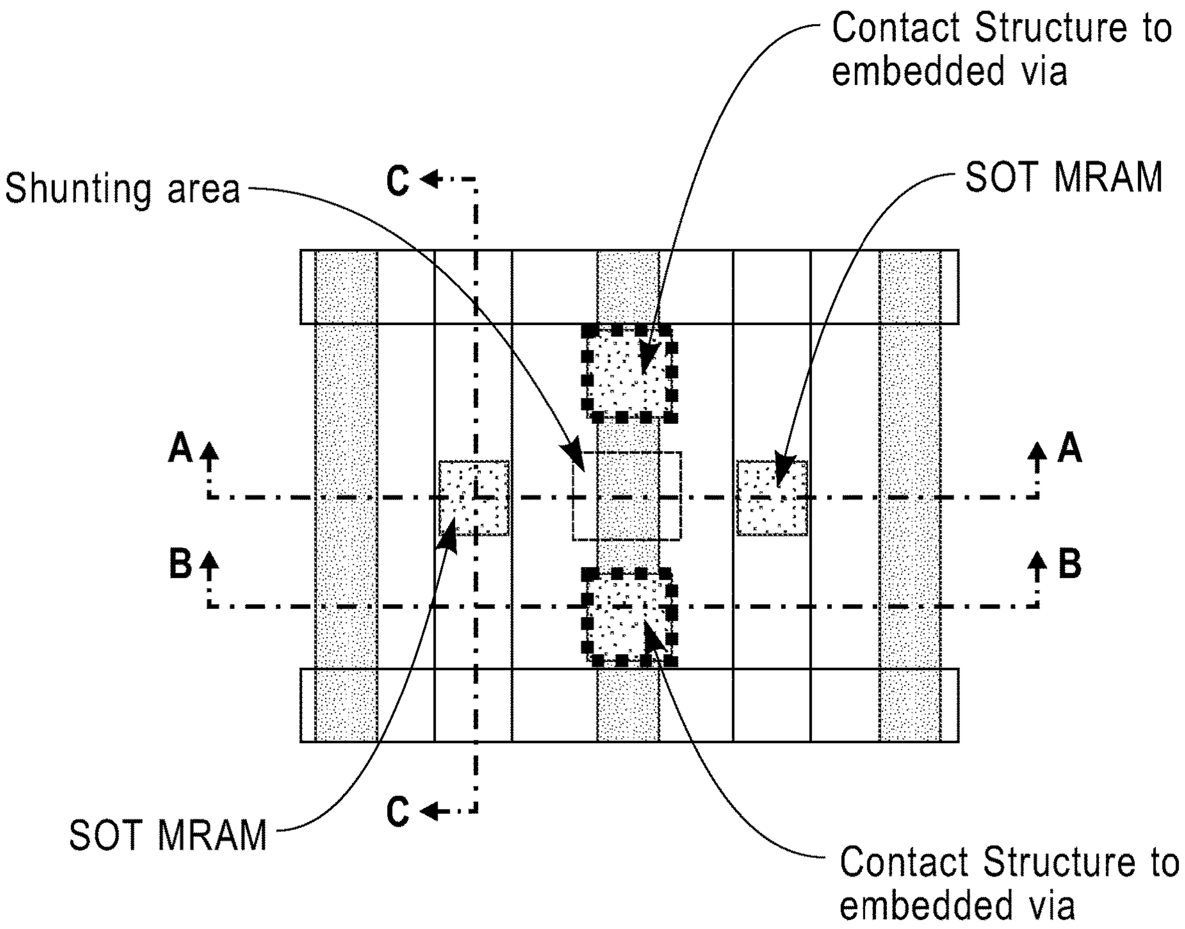
FIG. 1 is a top down view illustrating a device layout that can be used in the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

The terms substantially, substantially similar, about, or any other term denoting functionally equivalent similarities refer to instances in which the difference in length, height, or orientation convey no practical difference between the definite recitation (e.g., the phrase sans the substantially similar term), and the substantially similar variations. In one embodiment, substantial (and its derivatives) denote a difference by a generally accepted engineering or manufacturing tolerance for similar devices, up to, for example, 10% deviation in value or 10° deviation in angle.

A SOT MRAM structure with perpendicular magnetic free layer magnetization and memory structures including the same are provided. The SOT MRAM structure includes a spin conductor charge insulator layer having a horizontal portion and a vertical portion, and a spin conductor layer contacting the horizontal portion of the spin conductor charge insulator layer and a first sidewall of the vertical portion of the spin conductor charge insulator layer. The SOT MRAM structure further includes a MTJ structure including a magnetic free layer, a magnetic tunnel barrier layer, and a magnetic reference layer in which the magnetic free layer is in direct physical contact with the spin conductor layer. The SOT MRAM structure further includes a MTJ cap contacting the MTJ structure, a MRAM electrode-containing hard mask contacting the MTJ cap, and an I-shaped SOT channel located on a second sidewall of the vertical portion of the spin conductor charge insulator layer and having a bottommost surface that is vertically offset from a bottommost surface of the spin conductor charge insulator layer. In the memory structure, an interface between each of the spin conductor charge insulator layer, the spin conductor layer, the I-shaped SOT channel, the MTJ structure and the MTJ cap is a pure material interface. The SOT MRAM structure further includes a dielectric pillar located adjacent to, and in direct contact with, the I-shaped SOT channel. These and other aspects of the present application will be described in greater detail herein below.

Referring first to FIG. 1, there is illustrated a device layout that can be used in the present application. Notably, the device layout illustrated in FIG. 1 can be used for a SOT MRAM structure in accordance with the present application. The device layout illustrated in FIG. 1 includes cut A-A, cut B-B and cut C-C. Cut A-A is through an area in which an adjacent pair of SOT MRAM structures of the present application will be formed; cut A-A pass through an area in which shunting of the two adjacent SOT MRAMs can be performed. Cut B-B is through an area in which a first contact structure can be formed that contacts a sidewall SOT structure of each adjacent pairs of SOT MRAMS and an electrically conductive via structure that is embedded in a first interconnect dielectric layer. Cut C-C is through an area that includes a single SOT MRAM.

Figure 2A:
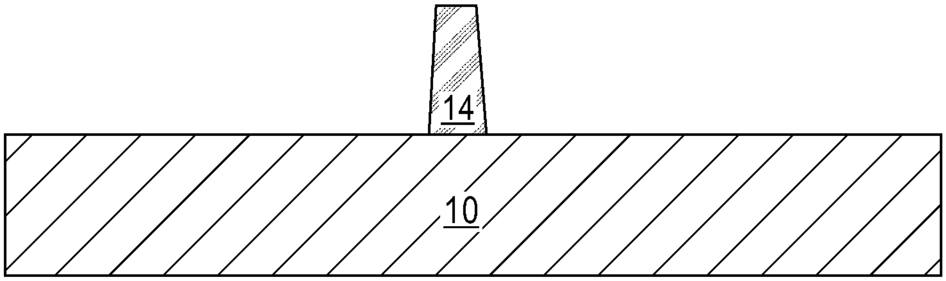
FIGS. 2A-2B are cross sectional views of an exemplary back-end-of-the-line (BEOL) structure through cut A-A and B-B of FIG. 1, respectively, that can be employed in accordance with an embodiment of the present application, the exemplary BEOL structure includes a first interconnect dielectric layer, an electrically conductive via structure embedded in the first interlayer dielectric layer and a column of dielectric pillars (i.e., step dielectric structures).
Figure 2B:
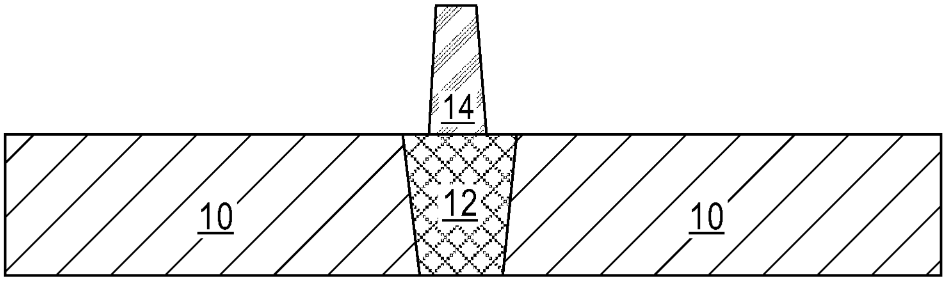

Referring now to FIGS. 2A-2B, there are illustrated an exemplary BEOL structure through cut A-A and B-B of FIG. 1, respectively, that can be employed in accordance with an embodiment of the present application. The exemplary BEOL structure illustrated in FIG. 1 includes a first interconnect dielectric layer 10, an electrically conductive via structure 12 embedded in the first interlayer dielectric layer 10 and a dielectric pillar 14 (i.e., a step dielectric structure). Although a single electrically conductive via structure 12 is described and illustrated, a plurality of electrically conductive via structures 12 can be formed in the first interconnect dielectric layer 10. In the present application, a plurality of dielectric pillars 14 can be formed. In this embodiment, the dielectric pillars 14 would be in a column that includes the contact structure to embedded via area and the shunting area.

Although not shown, the exemplary BEOL structure of FIG. 1 can be formed on a surface of a substrate that includes a front-end-of-the-line (FEOL) level and a middle-of-the-line (MOL) level. The FEOL level includes one of more FEOL semiconductor devices such as, for example, transistors, capacitors and/or diodes formed therein. The FEOL semiconductor devices can provide logic and memory read/write functionalities. The MOL level is formed on the FEOL level and the MOL level typically includes one or more MOL contact structures embedded in a MOL dielectric material. The FEOL level and the MOL level can include materials that are well known to those skilled in the art, and each of the FEOL level and the MOL level can be formed utilizing processing techniques that are also well known to those skilled in the art. In some embodiments, the substrate in which the exemplary BEOL structure of FIGS. 2A-2B can be formed includes one or more lower interconnect levels that are located on the MOL level. In such an embodiment, the exemplary BEOL structure of FIGS. 2A-2B represents an upper BEOL level of a multileveled BEOL structure.

The first interconnect dielectric layer 10, is composed of any interconnect dielectric material including, for example, silicon oxide (SiOx), silsesquioxanes, C doped oxides (i.e., organosilicates) that includes atoms of Si, C, O and H, thermosetting polyarylene ethers, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like. The first interconnect dielectric layer 10 can have a dielectric constant (all dielectric constants mentioned herein are measured relative to a vacuum, unless otherwise stated) that is about 4.0 or less. In one embodiment, the first interconnect dielectric layer 10 has a dielectric constant of 2.8 or less. These dielectrics generally having a lower parasitic cross talk as compared to dielectric materials whose dielectric constant is greater than 4.0.

The electrically conductive via structure 12 that can be employed in the present application is composed of an electrically conductive metal or electrically conductive metal alloy. Illustrative examples of electrically conductive materials that can be used in the present application to provide the electrically conductive via structure 12 include, but are not limited to, Cu, Al, Cu—Al alloy, W, Ru, or Rh. In some embodiments (not shown), a diffusion barrier liner can be present along at least a sidewall (and in some embodiments along a bottom wall) of the electrically conductive via structure 12. When present, the diffusion barrier liner can be composed of any well-known diffusion barrier material such as, for example, Ta, TaN, Ti, TiN, W or WN. In some embodiments, the diffusion barrier liner can include a material stack of two or more diffusion barrier materials. In one example, the diffusion barrier liner can be composed of a stack of Ta/TaN or a stack of Ti/TiN.

The interconnect level including the first interconnect dielectric layer 10 and the electrically conductive via structure 12 can be formed utilizing BEOL processing techniques well known to those skilled in the art including, for example, deposition of the first interconnect dielectric layer 10, followed by a damascene process that provides the electrically conductive via structure 12. The first interconnect dielectric layer 10 can be deposited by, for example, chemical vapor deposition (CVD), plasma enhanced chemical vapor deposition (PECVD) or spin-on coating. The damascene process includes lithographically forming a via opening into the first interconnect dielectric layer 10, depositing the electrically conductive metal or electrically conductive metal alloy in the via opening, and thereafter performing a planarization process such as, for example, chemical mechanical polishing (CMP). The electrically conductive metal or electrically conductive metal alloy that provides the electrically conductive via structure 12 can be formed by a deposition process such as, for example, CEVD, PECVD, sputtering, or plating.

The dielectric pillar 14 is composed of a first dielectric material that is typically compositionally different from the first interconnect dielectric layer 10. Illustrative examples of first dielectric materials that can be used in providing the dielectric pillar 14 include, but are not limited to, silicon dioxide, silicon nitride, hafnium dioxide, aluminum oxide or any combination thereof. The dielectric pillar 14 can be formed by depositing a blanket layer of the first dielectric material on the interconnect level including the first interconnect dielectric layer 10 and the electrically conductive via structure 12. The depositing of the blanket layer of the first dielectric material can include, CVD, PECVD, physical vapor deposition (PVD), or atomic layer deposition (ALD). Following the deposition of the blanket layer of the first dielectric material, the blanket layer of the first dielectric material is patterned by lithography and etching to provide the dielectric pillar as shown in FIGS. 2A and 2B. Throughout the present application and unless stated otherwise, the term "lithography" denotes a process in which a photoresist material is formed via deposition (e.g., CVD, PECVD or spin-on coating) on a layer or combination of layers that need to be patterned. The as-deposited photoresist material is then exposed to a pattern of irradiation and thereafter the exposed photoresist material is developed using a conventional developer. The etching used in providing the dielectric pillar 14 includes a dry etching process (such as, for example, reactive ion beam etching (RIE), plasma etching or ion beam etching (IBE)), a chemical wet etching process, or a combination of dry etching and chemical wet etching.

Figure 3A:
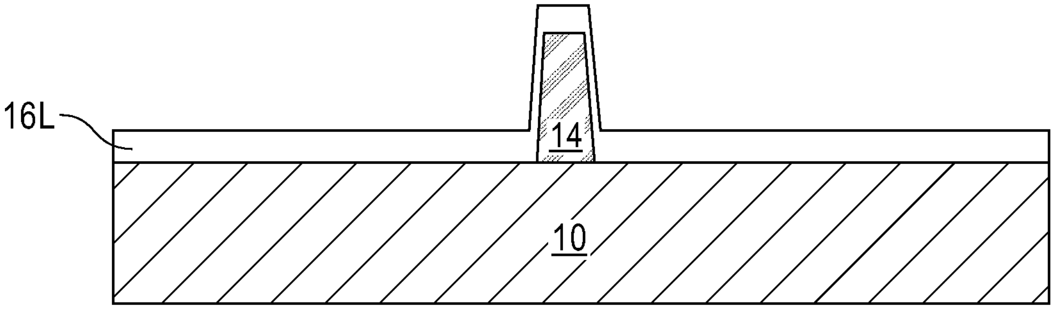
FIGS. 3A and 3B are cross sectional view of the exemplary BEOL structure shown in FIGS. 2A and 2B, respectively, after forming a blanket layer of dielectric material on physically exposed surfaces of the first interconnect dielectric layer, the electrically conductive via structure and each dielectric pillar.
Figure 3B:
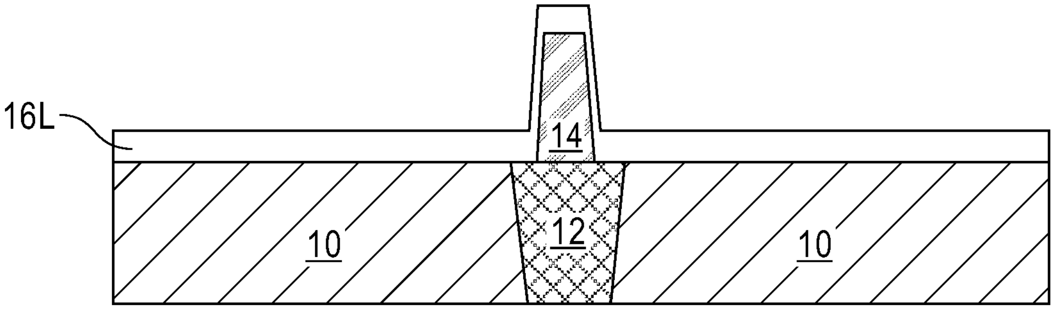

Referring now to FIGS. 3A and 3B, there are illustrated the exemplary BEOL structure shown in FIGS. 2A and 2B, respectively, after forming a blanket layer of dielectric material 16L on physically exposed surfaces of the first interconnect dielectric layer 10, the electrically conductive via structure 12 and the dielectric pillar 14. The blanket layer of dielectric material 16L is composed of a second dielectric material that is compositionally different from the first dielectric material that provides the dielectric pillar 14. Illustrative examples of second dielectric materials that can be used in providing the blanket layer of dielectric material 16L include, but are not limited to, silicon dioxide, silicon nitride, hafnium dioxide, aluminum oxide or any combination thereof. The blanket layer of dielectric material 16L can be formed by a deposition process such as, for example, directional PVD. As is shown, the blanket layer of dielectric material 16L is formed along the sidewalls and on top of the dielectric pillar 14.

Figure 4A:
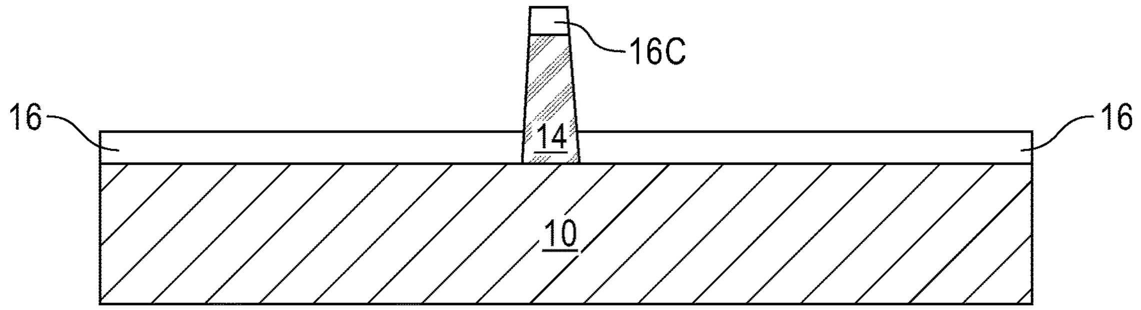
FIGS. 4A and 4B are cross sectional view of the exemplary BEOL structure shown in FIGS. 3A and 3B, respectively, after removing the blanket layer of dielectric material from the sidewall of the interconnect dielectric pillar, while maintaining a first portion of the blanket layer of dielectric material on the first interconnect dielectric layer and the electrically conductive via structure, and a second portion of the blanket layer of dielectric material on top of the dielectric pillar.
Figure 4B:
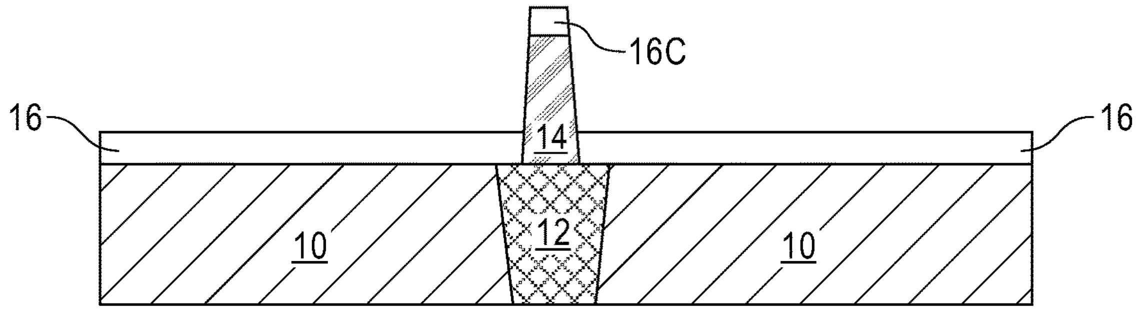

Referring now to FIGS. 4A and 4B, there are illustrated the exemplary BEOL structure shown in FIGS. 3A and 3B, respectively, after removing the blanket layer of dielectric material 16L from the sidewall of the dielectric pillar 14, while maintaining a first portion of the blanket layer of dielectric material 16L on the first interconnect dielectric layer 10 and the electrically conductive via structure 12 and a second portion of the blanket layer of dielectric material on top of the dielectric pillar 14. The remaining first portion of the blanket layer of dielectric material 16L is referred to herein as a sacrificial dielectric layer 16 and the remaining second portion of the blanket layer of dielectric material 16L is referred to herein as a dielectric cap 16C. The removal of the blanket layer of dielectric material 16L from the sidewall of the dielectric pillar 14 can include an etching process such as, for example, a chemical wet etch or isotropic RIE. After removing the blanket layer of dielectric material 16L from the sidewall of the dielectric pillar 14, an upper portion of the sidewall of the dielectric pillar 14 is physically exposed; a lower portion of the sidewall of dielectric pillar 14 is in direct physical contact with the sacrificial dielectric layer 16 (i.e., the remaining first portion of the blanket layer of dielectric material 16L).

Figure 5A:
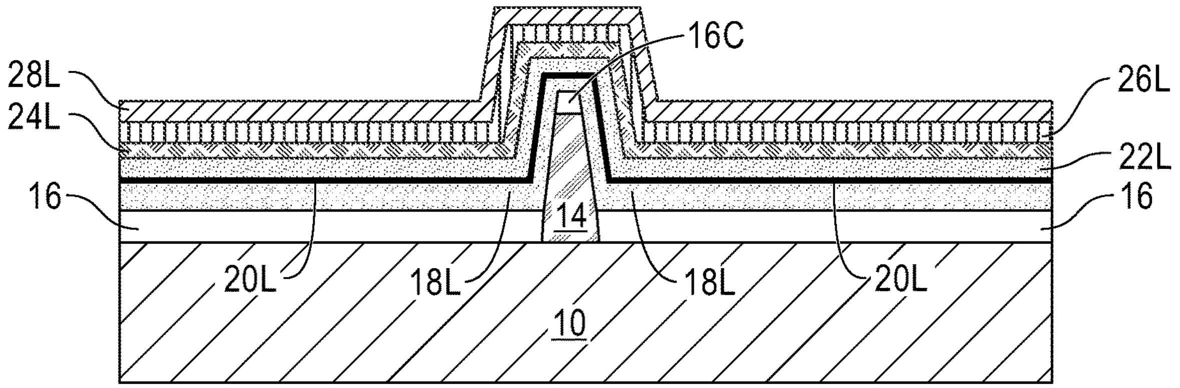
FIGS. 5A and 5B are cross sectional view of the exemplary BEOL structure shown in FIGS. 4A and 4B, respectively, after forming a material stack of, from bottom to top, a blanket layer of SOT material, a blanket layer of spin conductor charge insulator material, a blanket layer of spin conductor material, blanket layers of MTJ materials, a blanket layer of MTJ cap material, and a blanket layer of sacrificial hard mask material.
Figure 5B:
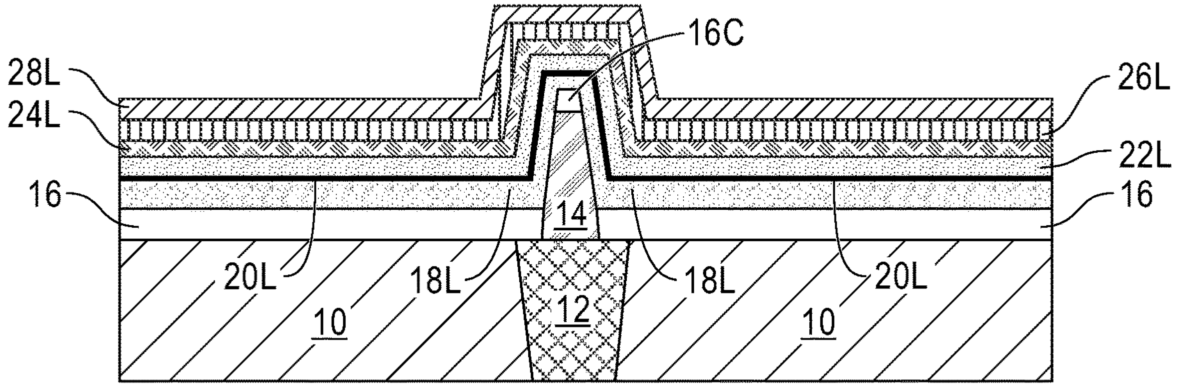

Referring now to FIGS. 5A and 5B, there are illustrated the exemplary BEOL structure shown in FIGS. 4A and 4B, respectively, after forming a material stack of, from bottom to top, a blanket layer of SOT material 18L, a blanket layer of spin conductor charge insulator material 20L, a blanket layer of spin conductor material 22L, blanket layers of MTJ materials 24L (these blanket layers of MTJ materials are shown as a single layer in the drawings of the present application), a blanket layer of MTJ cap material 26L and a blanket layer of sacrificial hard mask material 28L.

The material stack, except for possibly the blanket layer of sacrificial hard mask material 28L, can be formed utilizing one or more in-situ deposition processes including, but not limited to, CVD, PECVD, PVD, ALD (including plasma enhanced ALD) or sputtering. The in-situ deposition processes are performed without exposing any of the depositions to an external ambient such as, for example, air. Thus, each material interface that is present between the deposited blanket layers in the material stack is a pure material interface. The term "pure material interface" denotes an interface between two contacting layers that is composed of only elements of those two contacting layers without containing any external element such as oxygen, carbon or nitride. In the present application, the pure material interfaces contain an external element content of less than 10 ppm, more typically the external element content is less than 1 ppm. Having such pure material interfaces in the material stack can prevent any deleterious effects on the magnetic properties of each of the blanket layers that are present in the material stack. For example, a pure material interface in the in-situ deposited material stack can avoid spin scattering issues which can exist when the material stack is not formed by one or more in-situ deposition processes.

The blanket layer of SOT material 18L is composed of a SOT channel material. The SOT channel material employed in the present application provides the necessary charge-to-spin conversion while carrying the same charge current through the resultant MTJ structure. Exemplary SOT channel materials that can be employed include, but are not limited to, β-Ta, β-W, $Cu_xPt_{1-x}$, $Cu_{1-x}Ta_x$, $Pd_xPt_{1-x}$, $Au_xPt_{1-x}$, Pt, $Bi_2Se_3$, $WTe_2$, $PtTe_2$, $TaS_2$, $Pt_xRh_{1-x}$ or any materials known to produce large SOT charge-to-spin conversion efficiency, where x is from 0 to 1. Other types of SOT-like channel materials that can be employed are the so-called orbital-moment generating alloys, such as CuOx/Pt or CuN/Pt. The blanket layer of SOT material 18L can have a thickness from 1 nm to 20 nm; although other thicknesses are possible and can be used as the thickness of the blanket layer of SOT material 18L.

The blanket layer of spin conductor charge insulator material 20L is composed of a magnetic insulator. Magnetic insulators that can be employed as the blanket layer of spin conductor charge insulator material 20L are high spin-conducting materials that are also an insulator for charge conductance. Exemplary magnetic insulators that can be employed as the blanket layer of spin conductor charge insulator material 20L include, but are not limited to, $FeO_x$, NiO, or YIG ($Y_3Fe_5O_{12}$). The blanket layer of spin conductor charge insulator material 20L can have a thickness from 0.5 nm to 5 nm; although other thicknesses are possible and can be used as the thickness of the blanket layer of spin conductor charge insulator material 20L.

The blanket layer of spin conductor material 22L is composed of a metal or metal alloy that has a high spin-conductance and a long spin-diffusion length. The spin-collector materials exhibit a low spin loss. Exemplary spin-collector materials that can be used in the present application as the blanket layer of spin conductor material 22L include, but are not limited to, Cu, Ag, Au or alloys thereof. The blanket layer of spin conductor material 22L can have a thickness from 3 nm to 100 nm; although other thicknesses are possible and can be used as the thickness of the blanket layer of spin conductor material 22L.

The blanket layers of MTJ materials 24L includes a magnetic free layer, a tunnel barrier layer and a magnetic reference layer. In the present application, the magnetic free layer of the blanket layer of MTJ materials forms a direct interface with the blanket layer of spin conductor material 22L. The magnetic free layer of the blanket layers of MTJ materials 24L is composed of at least one magnetic material with a magnetization that can be changed in orientation relative to the magnetization orientation of the magnetic reference material; note that the term "magnetic free material" denotes that this magnetic layer does not have a fixed magnetization; the term does not however mean that this layer does not contain a magnetic material. Exemplary materials for magnetic free layer include, but are not limited to, alloys and/or multilayers of cobalt, iron, alloys of cobalt-iron, nickel, alloys of nickel-iron, and alloys of cobalt-iron-boron. The magnetic free layer can have a thickness from 0.3 nm to 3 nm; although other thicknesses are possible and can be used as the thickness of the magnetic free layer.

In some embodiments, the magnetic free layer is replaced by a multilayer layer structure that includes a non-magnetic layer that is sandwiched between a bottom magnetic free layer and a top magnetic free layer. The top and bottom magnetic free layers are components of magnetic materials as mentioned above for the magnetic free layer. The non-magnetic layer is composed of a non-magnetic material that contains at least one element with an atomic number less than 74 such as, for example, Be, Mg, Al, Ca, B, C, Si, V, Cr, Ti, Mn or any combination including alloys thereof. The thickness of the non-magnetic layer is thin enough to allow the bottom and top magnetic free layers to couple together magnetically so that in equilibrium bottom and top magnetic are always parallel. In one example, the non-magnetic layer has a thickness from 0.3 nm to 3.0 nm.

The tunnel barrier layer of the blanket layers of MTJ materials 24L is composed of an insulator material and is formed at such a thickness as to provide an appropriate tunneling resistance. Exemplary insulator materials for the tunnel barrier layer the blanket layers of the MTJ materials 24L include, but are not limited to, magnesium oxide, aluminum oxide, and titanium oxide, or materials of higher electrical tunnel conductance, such as semiconductors or low-bandgap insulators. The thickness of the tunnel barrier layer will depend on the material selected. In one example, the tunnel barrier layer can have a thickness from 0.5 nm to 1.5 nm; although other thicknesses are possible as long as the thickness of the tunnel barrier layer provides an appropriate tunneling resistance.

The magnetic reference layer of the blanket layers of MTJ materials 24L has a fixed magnetization. The magnetic reference layer of the blanket layers of MTJ materials 24L is composed of a metal or metal alloy that includes one or more metals exhibiting high spin polarization. In alternative embodiments, exemplary metals for the formation of the magnetic reference layer include iron, nickel, cobalt, chromium, boron, and manganese. Exemplary metal alloys can include the metals exemplified by the above. In another embodiment, the magnetic reference layer 30 can be a multilayer arrangement having (1) a high spin polarization region formed from of a metal and/or metal alloy using the metals mentioned above, and (2) a region constructed of a material or materials that exhibit strong perpendicular magnetic anisotropy (strong PMA). Exemplary materials with strong PMA that can be used include a metal such as cobalt, nickel, platinum, palladium, iridium, or ruthenium, and can be arranged as alternating layers. The strong PMA region can also include alloys that exhibit strong PMA, with exemplary alloys including cobalt-iron-terbium, cobalt-iron-gadolinium, cobalt-chromium-platinum, cobalt-platinum, cobalt-palladium, iron-platinum, and/or iron-palladium. The alloys can be arranged as alternating layers. In some embodiments, these alternating layers in the magnetic reference layer can be separated by exchange-coupling layers (such as Ru) so as to have oppositely aligned magnetization directions, forming the so-called synthetic antiferromagnets in order to reduce dipolar coupling between the magnetic reference layer and the magnetic free layer. In one embodiment, combinations of these materials and regions can also be employed. The magnetic reference layer can have a thickness from 1 nm to 15 nm; although other thicknesses are possible and can be used as the thickness of the magnetic reference layer.

The blanket layer of MTJ cap material 26L is composed of any MTJ cap material including, but not limited to, Nb, NbN, W, WN, Ta, TaN, Ti, TiN, Ru, Mo, Cr, V, Pd, Pt, Rh, Sc, Al or other high melting point metals or conductive metal nitrides. The blanket layer of MTJ cap material 26L can have a thickness from 5 nm to 40 nm; other thicknesses are possible and can be used in the present application as the thickness of the blanket layer of MTJ cap material 26L.

The blanket layer of sacrificial hard mask material 28L can be composed of any hard mask material including, for example, TaN, TiN, Ta, Ti, silicon dioxide, silicon nitride or any combination thereof. The blanket layer of sacrificial hard mask material 28L can have a thickness from 5 nm to 50 nm; other thicknesses are possible and can be used in the present application as the thickness of the blanket layer of sacrificial hard mask material 28L. In some embodiments, the blanket layer of sacrificial hard mask material 28L can be formed utilizing an in-situ deposition as defined above. In other embodiments, the blanket layer of sacrificial hard mask material 28L can be formed utilizing a deposition process that is ex-situ compared to the other blanket layers within the material stack.

Figure 6A:
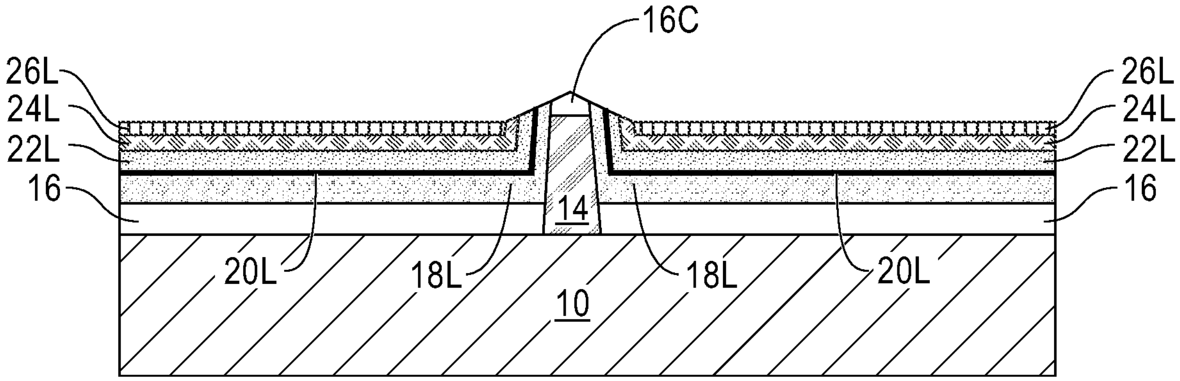
FIGS. 6A and 6B are cross sectional view of the exemplary BEOL structure shown in FIGS. 5A and 5B, respectively, after removing the material stack that is located on top of the second portion of the blanket layer of dielectric material that is on top of the dielectric pillar.
Figure 6B:
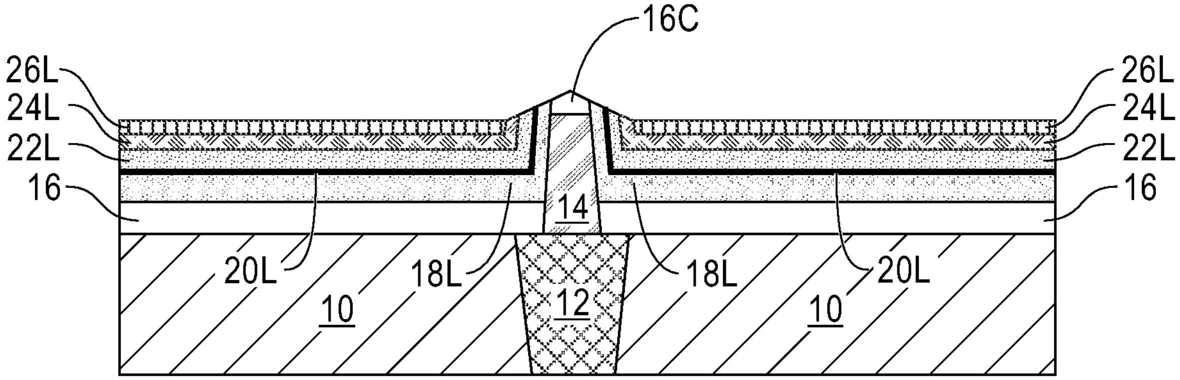

Referring now to FIGS. 6A and 6B, there are illustrated the exemplary BEOL structure shown in FIGS. 5A and 5B, respectively, after removing the material stack that is located on top of the second portion of the blanket layer of dielectric material (i.e., dielectric cap 16C) that is on top of the dielectric pillar 14. In some embodiments, the removal of the material stack that is located on top of the dielectric cap 16C can be performed utilizing an angled ion beam etching process. In other embodiments, the removal of the material stack that is located on top of the dielectric cap 16C can be performed by CMP. In either embodiment, the removal of the material stack stops on a surface of the dielectric cap 16C and as such the blanket layer of sacrificial hard mask material 28L is entirely removed during this step of the present application. As is shown in FIGS. 6B-6B, the material stack without the blanket layer of sacrificial hard mask material 28L remains to the left and right of the dielectric pillar 14.

Figure 7A:
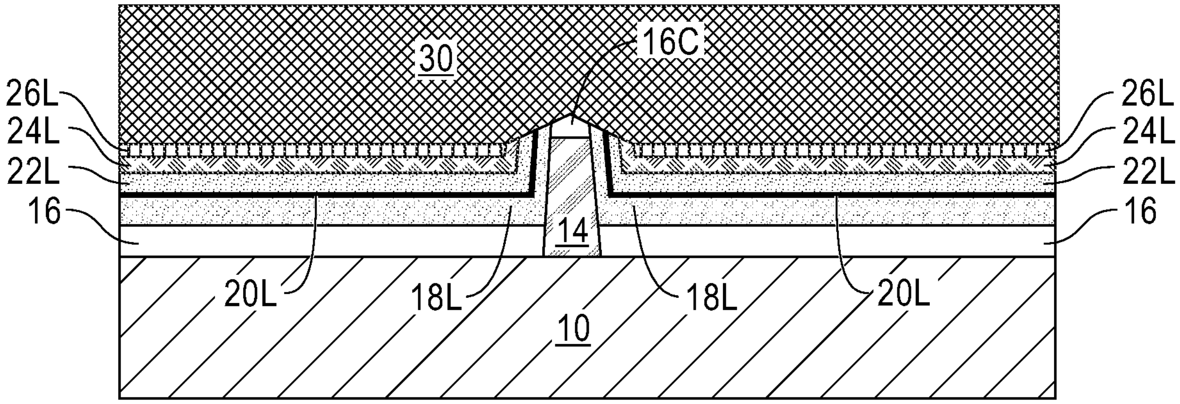
FIGS. 7A and 7B are cross sectional view of the exemplary BEOL structure shown in FIGS. 6A and 6B, respectively, after forming a blanket layer of MRAM electrode-containing hard mask material.
Figure 7B:
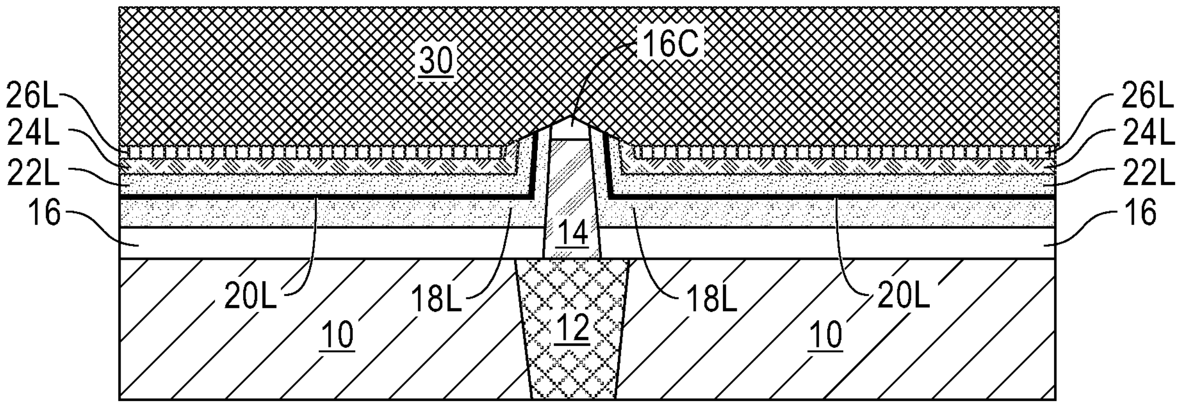

Referring now to FIGS. 7A and 7B, there are illustrated the exemplary BEOL structure shown in FIGS. 6A and 6B, respectively, after forming a blanket layer of MRAM electrode-containing hard mask material 30L. The blanket layer of MRAM electrode-containing hard mask material 30L is composed of an electrically conductive material such as, for example, Ta, TaN, Ti, TiN, Ru, RuN, RuTa, RuTaN, Co, CoWP, CoN, W, WN or any combination thereof. The blanket layer of MRAM electrode-containing hard mask material 30L will subsequently form an electrode of the SOT MRAM. The blanket layer of MRAM electrode-containing hard mask material 30L can have a thickness from 10 nm to 200 nm; other thicknesses are possible and can be used in the present application as the thickness of the blanket layer of MRAM electrode-containing hard mask material 30L. The blanket layer of MRAM electrode-containing hard mask material 30L can be formed by a deposition process such as, for example, CVD, PECVD, PVD, ALD (including plasma enhanced ALD) or sputtering. In some embodiments, a planarization process such as, for example, CMP can follow the deposition process. As is illustrated, the blanket layer of MRAM electrode-containing hard mask material 30L is formed directly on a physically exposed surface of the blanket layer of MTJ cap 26L of the remaining material stack and on a physically exposed surface of the dielectric cap 16C.

Figure 8A:
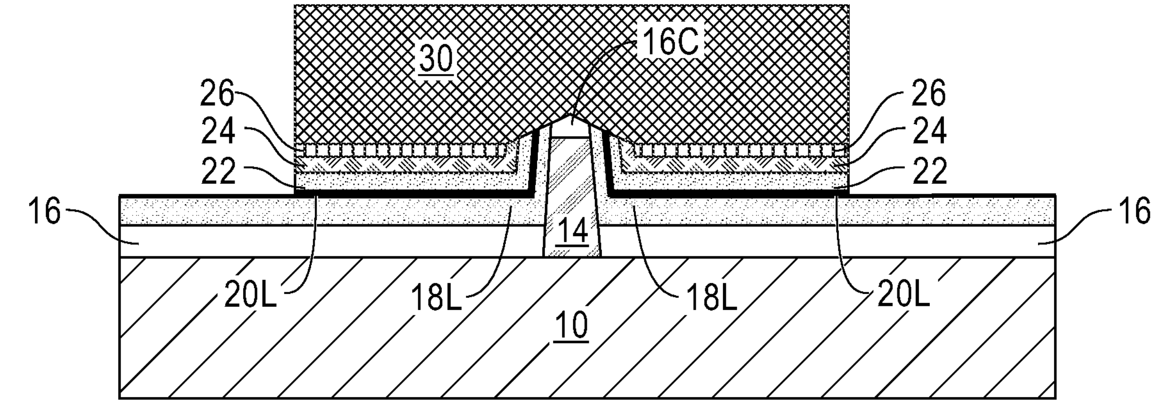
FIGS. 8A and 8B are cross sectional view of the exemplary BEOL structure shown in FIGS. 7A and 7B, respectively, after patterning the blanket layer of MRAM electrode-containing hard mask material and an upper portion of the remaining material stack.
Figure 8B:
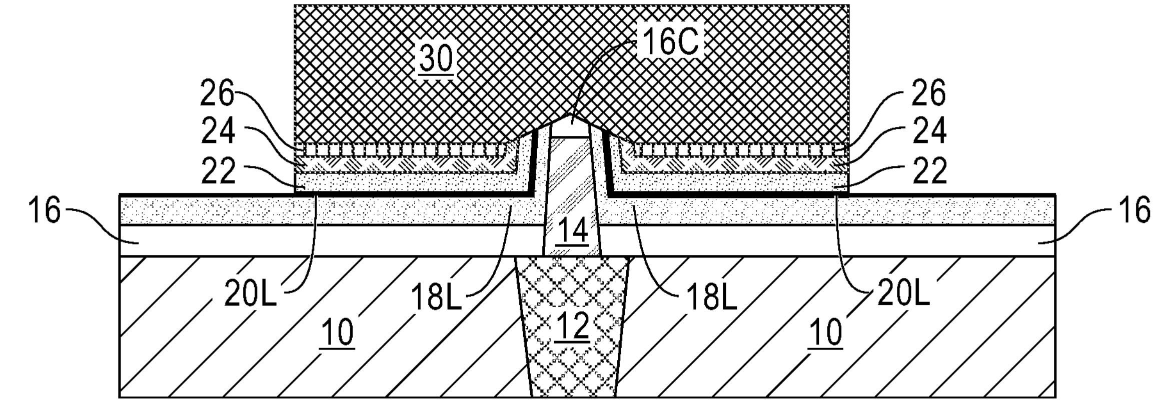

Referring now to FIGS. 8A and 8B, there are illustrated the exemplary BEOL structure shown in FIGS. 7A and 7B, respectively, after patterning the blanket layer of MRAM electrode-containing hard mask material 30L and an upper portion of the remaining material stack. The patterning includes a first patterning step in which lithography and etching are employed to patterning the blanket layer of MRAM electrode-containing hard mask material 30L into a MRAM electrode-containing hard mask 30. The MRAM electrode-containing hard mask 30 is then used as a patterned mask, and an end-point detection RIE or IBE etch is then used in a second patterning step to pattern the upper portion of the remaining material stack. The etch used to pattern the upper portion of the remaining material stack stops on a sub-surface of either the blanket layer of spin conductor charge insulator material 20L or the blanket layer of SOT material 18L. In the illustrated embodiment, the etch used to pattern the upper portion of the remaining material stack stops of a sub-surface of the blanket layer of spin conductor charge insulator material 20L. The term "sub-surface" denotes a surface of a material layer or a structure that is located between a topmost surface and a bottommost surface of the material layer of the structure.

After the second patterning step, a portion of each of the blanket layer of MTJ cap material 26L, the blanket layers of MTJ materials 24L and the blanket layer of spin conductor material 22L remain beneath the MRAM electrode-containing hard mask 30. The remaining portion of the blanket layer of MTJ cap material 26L is referred to herein as a MTJ cap 26, the remaining portion of the blanket layers of MTJ materials 24L is referred to herein as a MTJ structure 24, and the remaining portion of the blanket layer of spin conductor material 22L is referred to herein as spin conductor layer 22.

Figure 9A:
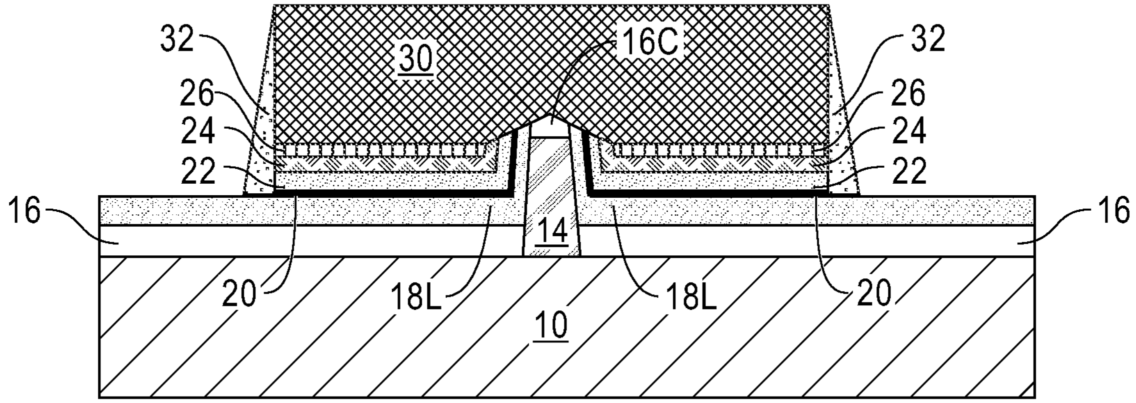
FIGS. 9A and 9B are cross sectional view of the exemplary BEOL structure shown in FIGS. 8A and 8B, respectively, after forming a dielectric spacer along a sidewall of a remaining portion of the blanket layer of MRAM electrode-containing hard mask material and a remaining portion of the upper portion of the material stack.
Figure 9B:
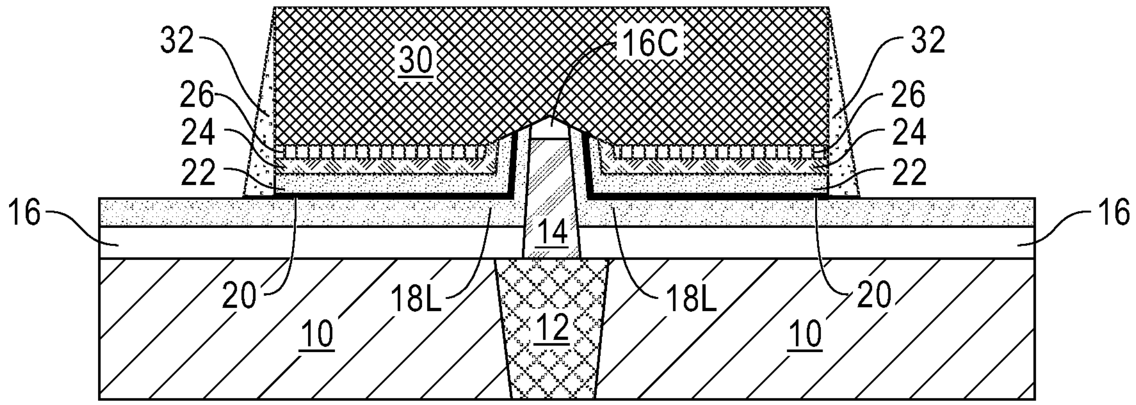

Referring now to FIGS. 9A and 9B, there are illustrated the exemplary BEOL structure shown in FIGS. 8A and 8B, respectively, after forming a dielectric spacer 32 along a sidewall of the MRAM electrode-containing hard mask 30, the MTJ cap 26, the MTJ structure 24 and the spin conductor layer 22. The dielectric spacer 32 is formed on top of a physically exposed sub-surface of either the blanket layer of spin conductor charge insulator material 20L or the blanket layer of SOT material 18L. In the illustrated embodiment, the dielectric spacer is formed on a sub-surface of the blanket layer of spin conductor charge insulator material 20L. Dielectric spacer 32 is composed of any dielectric spacer material including, for example, silicon dioxide, silicon nitride or aluminum oxide. The dielectric spacer 32 can be formed by deposition (e.g., PECVD or ALD), followed by a directional etch such as RIE or IBE. The dielectric spacer 32 can have a width that tapers outward from a topmost surface to a bottommost surface.

Figure 10A:
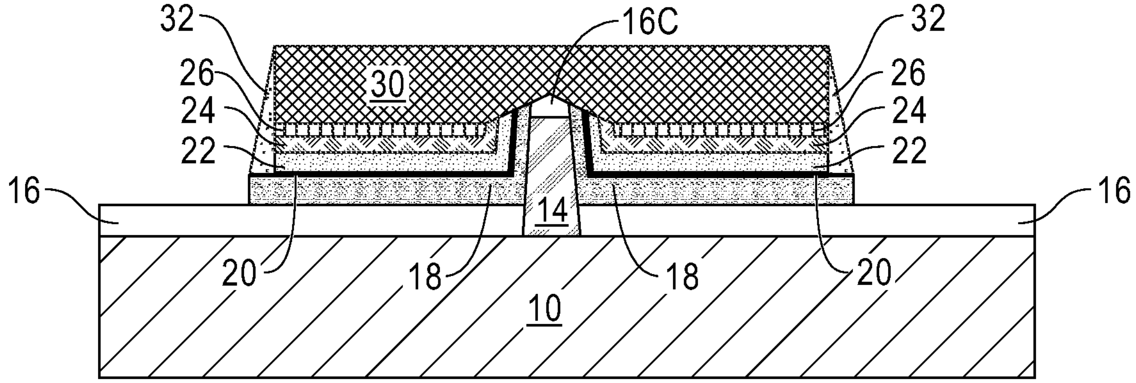
FIGS. 10A and 10B are cross sectional view of the exemplary BEOL structure shown in FIGS. 9A and 9B, respectively, after performing a directional etch to physically expose the first portion of the blanket layer of dielectric material that is located on the first interconnect dielectric layer.
Figure 10B:
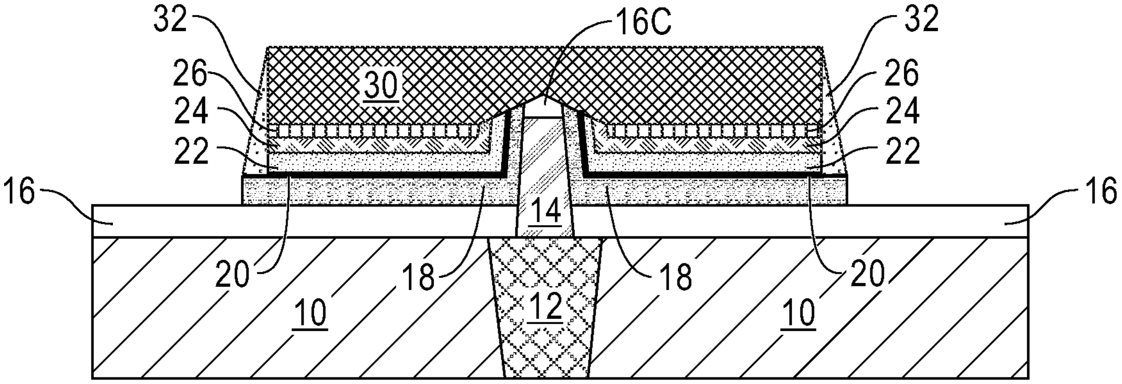

Referring now to FIGS. 10A and 10B, there are illustrated the exemplary BEOL structure shown in FIGS. 9A and 9B, respectively, after performing a directional etch such as, for example, RIE or IBE to physically expose the sacrificial dielectric layer 16 that is located on the first interconnect dielectric layer 10. The directional etch utilizes the dielectric spacer 32 and the MRAM electrode-containing hard mask 30 as a combined etch mask. In illustrated embodiment, a portion of the blanket layer of spin conductor charge insulator material 20L and a portion of the blanket layer of SOT material 18L remain beneath the combined etch mask after the directional etch. The remaining portion of the blanket layer of spin conductor charge insulator material 20L is referred to here as spin conductor charge insulator layer 20 and the remaining portion of the blanket layer of SOT material 18L is referred to herein as a SOT layer 18. In the illustrated embodiment, both the spin conductor charge insulator layer 20 and the SOT layer 18 have a width that is greater than the width of the MRAM electrode-containing hard mask 30, the MTJ cap 26, the MTJ structure 24 and the spin conductor layer 22.

Figure 11A:
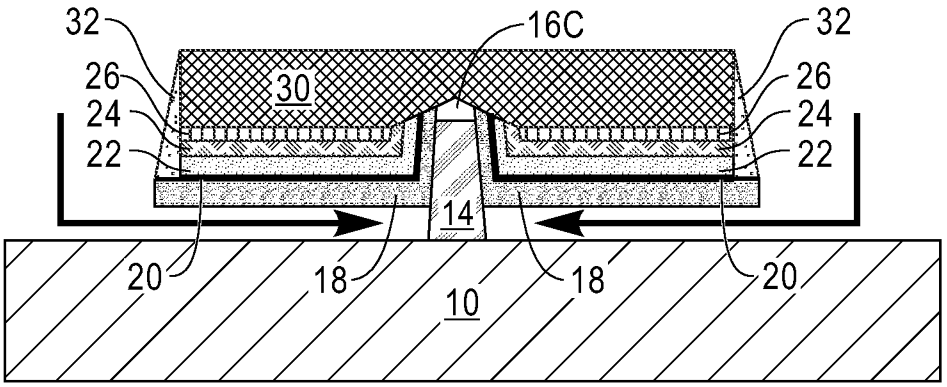
FIGS. 11A and 11B are cross sectional view of the exemplary BEOL structure shown in FIGS. 10A and 10B, respectively, after physically exposing a bottommost surface of the blanket layer of SOT material by removing the physically exposed first portion of the blanket layer of dielectric material.
Figure 11B:
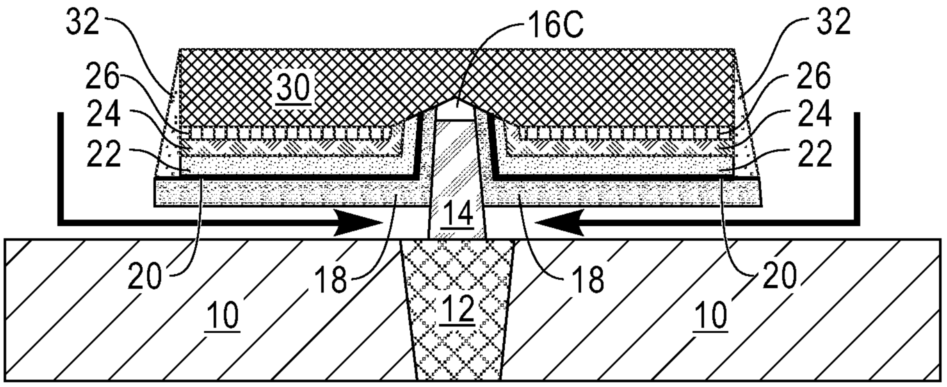

Referring now to FIGS. 11A and 11B, there are illustrated the exemplary BEOL structure shown in FIGS. 10A and 10B, respectively, after physically exposing a bottommost surface of the SOT layer 18 by removing the physically exposed sacrificial dielectric layer 16. This step of the present application includes a recess etching process that is selective in removing the sacrificial dielectric layer 16. In one example, and when the sacrificial dielectric layer 16 is composed of silicon dioxide, dilute hydrofluoric acid can be used.

Figure 12A:
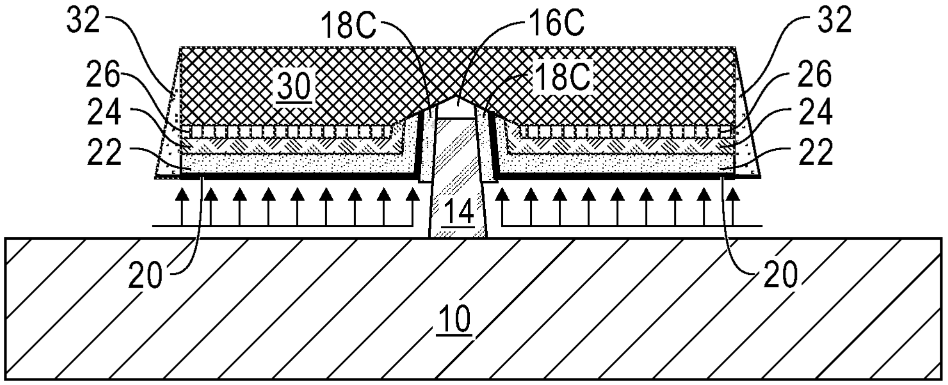
FIGS. 12A and 12B are cross sectional view of the exemplary BEOL structure shown in FIGS. 11A and 11B, respectively, after performing a selective and time controlled recess etch of the physically exposed blanket layer of SOT material.
Figure 12B:
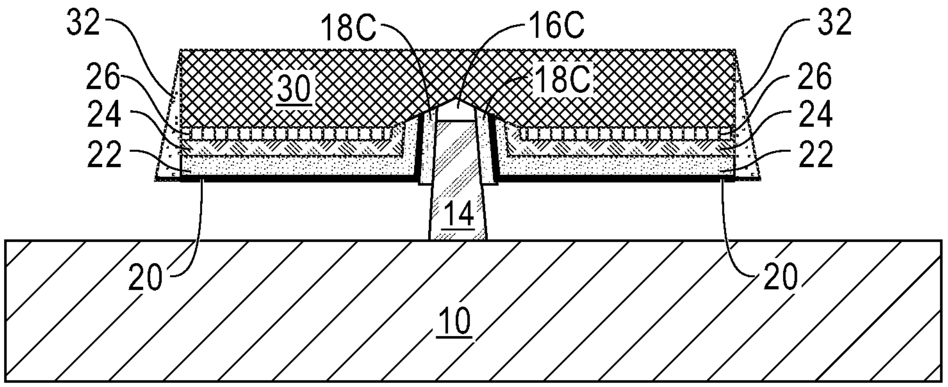

Referring now to FIGS. 12A and 12B, there are illustrated the exemplary BEOL structure shown in FIGS. 11A and 11B, respectively, after performing a selective and time controlled recess etch of the physically exposed SOT layer 18. This etch removes a horizontal component of the SOT layer 18 while leaving a vertical component of the SOT layer 18 along a sidewall of the dielectric pillar 14. This vertical component of the SOT layer 18 is referred to herein as an I-shaped SOT channel 18C. The term "I-shaped SOT channel" denotes a vertical channel that lacks any horizontal or diagonal portions that extends outward from the vertical channel; the vertical channel is oriented substantially 90° relative to the horizontal surface of the first interconnect dielectric material layer 10. In some embodiments, this etch includes $NF_3/H_2$ or an atomic layer etch when W is used as the SOT material. This etch stops on a bottommost surface of the spin conductor charge insulator layer 20. The I-shaped SOT channel 18C of the present application has a bottommost surface that is vertically offset from a bottommost surface the spin conductor charge insulator layer 20. In some embodiments and as illustrated in the drawings of the present application, the I-shaped SOT channel 18C has a bottommost surface that is positioned below a bottommost surface of the spin conductor charge insulator layer 20. In other embodiments, the I-shaped SOT channel 18C has a bottommost surface that is positioned above a bottommost surface of the spin conductor charge insulator layer 20.

Figure 13A:
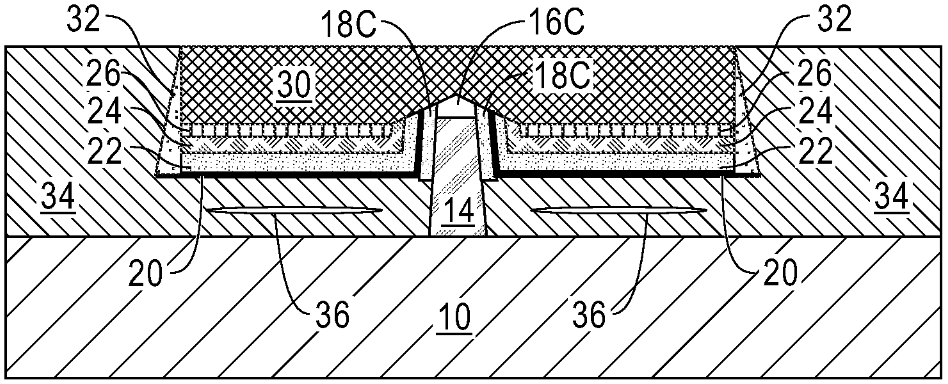
FIGS. 13A and 13B are cross sectional view of the exemplary BEOL structure shown in FIGS. 12A and 12B, respectively, after forming a second interconnect dielectric layer.
Figure 13B:
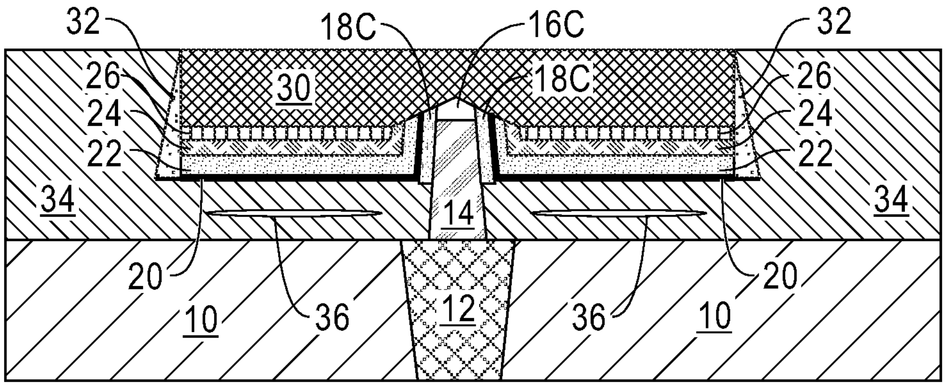

Referring now to FIGS. 13A and 13B, there are illustrated the exemplary BEOL structure shown in FIGS. 12A and 12B, respectively, after forming a second interconnect dielectric layer 34. The second interconnect dielectric layer 34 includes one of the interconnect dielectric materials mentioned above for the first interconnect dielectric layer 10. The interconnect dielectric material that provides the second interconnect dielectric layer 34 can be compositionally the same as, as compositionally different from, the interconnect dielectric material that provides the first interconnect dielectric layer 10. The second interconnect dielectric layer 34 can be formed utilizing one of the deposition processes mentioned above in forming the first interconnect dielectric layer 10. A planarization process such as, for example, CMP, can follow the deposition of the interconnect dielectric material that provides the second interconnect dielectric layer 34. In some embodiments, the second interconnect dielectric layer 34 can include a void 36. The void 36 is formed in area beneath the spin conductor charge insulator layer 20. As is shown, the second interconnect dielectric layer 34 forms a material interface with the first interconnect dielectric layer 10, the dielectric spacer 32 and the bottommost surface of the both the I-shaped SOT channel 18C and the spin conductor charge insulator layer 20. The second interconnect dielectric layer 34 can also form an interface with a sidewall edge of the spin conductor charge insulator layer 20.

Figure 14A:
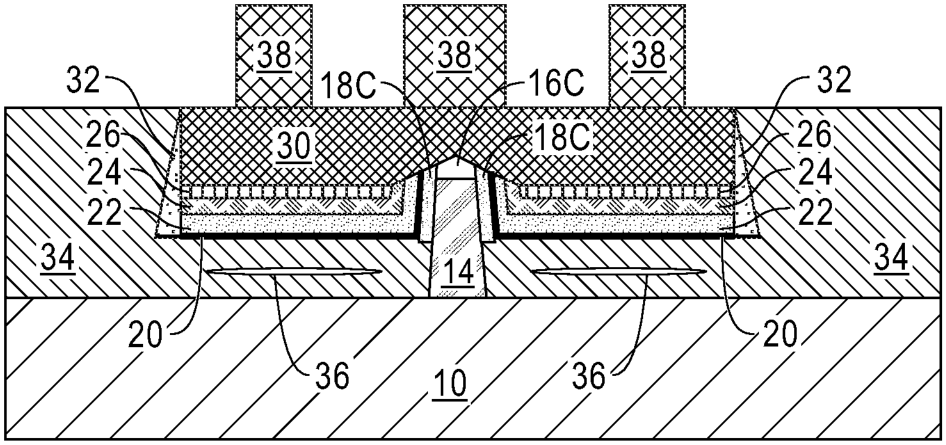
FIGS. 14A and 14B are cross sectional view of the exemplary BEOL structure shown in FIGS. 13A and 13B, respectively, after forming patterned masks on the remaining portion of the blanket layer of MRAM electrode-containing hard mask material, wherein at least one of the patterned masks is formed over one of the dielectric pillars.
Figure 14B:
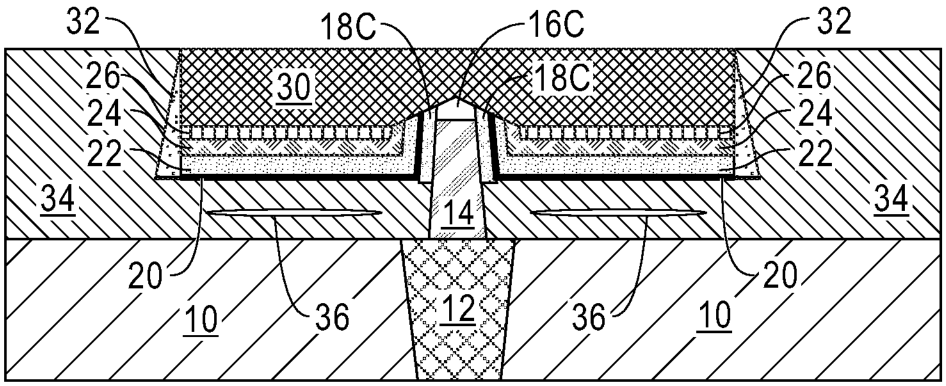

Referring now to FIGS. 14A and 14B, there are illustrated the exemplary BEOL structure shown in FIGS. 13A and 13B, respectively, after forming patterned masks 38 on the MRAM electrode-containing hard mask 30, wherein at least one of the patterned mask 38 is formed over one of the dielectric pillars 14 (See, FIG. 14A). The patterned masks 38 are composed of any masking material such as, for example, an organic planarization material. The patterned masks 38 can be formed by lithography and etching.

Figure 15A:
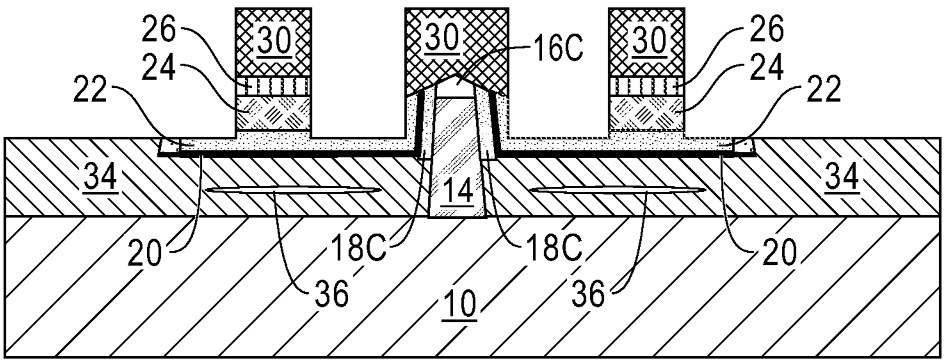
FIGS. 15A and 15B are cross sectional view of the exemplary BEOL structure shown in FIGS. 14A and 14B, respectively, after performing an MTJ patterning process, the MTJ patterning process forms SOT MRAMs.
Figure 15B:
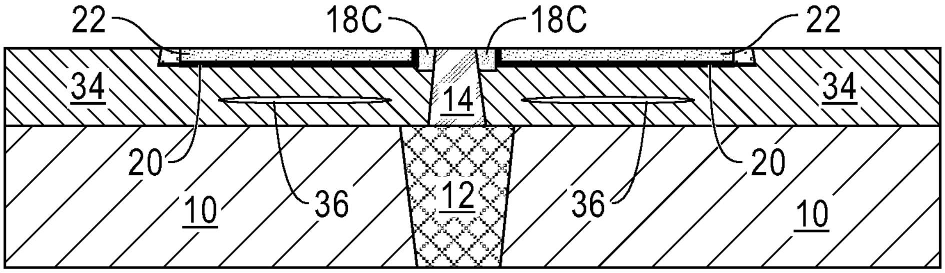

Referring now to FIGS. 15A and 15B, there are illustrated the exemplary BEOL structure shown in FIGS. 14A and 14B, respectively, after performing an MTJ patterning process, the MTJ patterning process forms SOT MRAMs; two of which are illustrated in FIG. 14A. The MTJ patterning process includes an etching process such as, for example, RIE or IBE. This etch stops on a surface of the spin conductor layer 22 and typically removes the dielectric spacers 32 from the structure. The patterned masks 38 are removed from the exemplary BEOL structure after the MTJ patterning utilizing any removal process that is selective in removing the patterned masks 38. Each SOT MRAM includes MRAM electrode-containing hard mask 30 (as an electrode), MTJ cap 26, MTJ structure 24, spin conductor layer 22, spin conductor charge insulator layer 20 and I-shaped SOT channel 18C. As is shown, both the spin conductor layer 22 and the spin conductor charge insulator layer 20 have a horizontal component beneath the MTJ structure 24 and a vertical component that is adjacent to a side wall of one of the dielectric pillars 16. Note that in the area in which a contact structure will be formed to the electrically conductive via structure 12 (See, FIG. 15B), this step of the present application removes the MRAM electrode-containing hard mask 30, the MTJ cap 26, and the MTJ structure 24 and a portion of the dielectric pillar 14, and physically exposes the spin conductor layer 22 and the I-shaped SOT channel 18C.

Figure 16A:
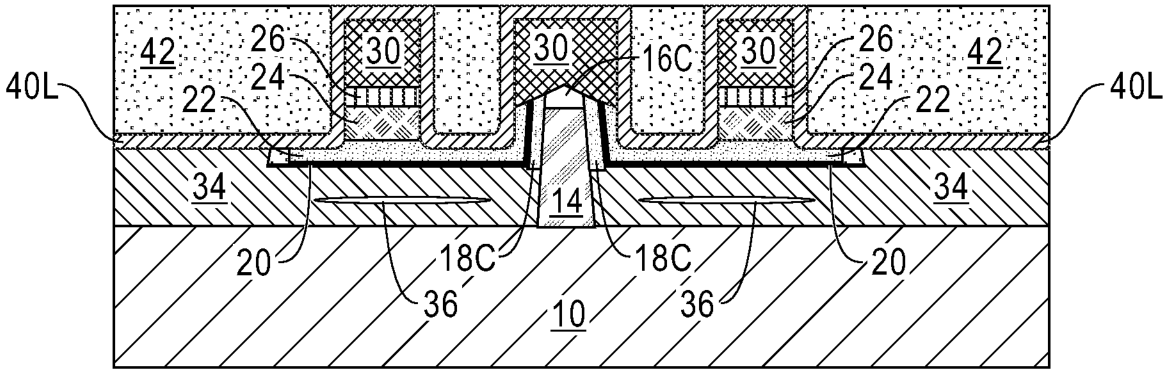
FIGS. 16A and 16B are cross sectional view of the exemplary BEOL structure shown in FIGS. 15A and 15B, respectively, after forming an encapsulation liner, and a third interconnect dielectric layer.
Figure 16B:
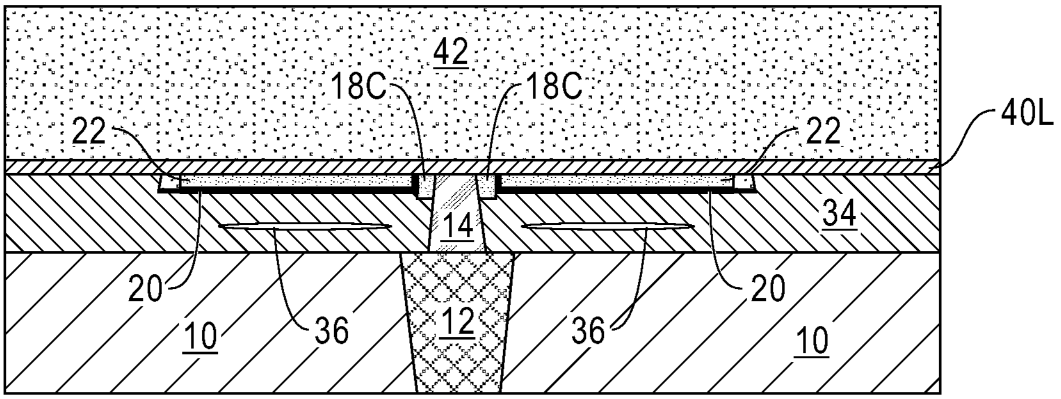

Referring now to FIGS. 16A and 16B, there is illustrated the exemplary BEOL structure shown in FIGS. 15A and 15B, respectively, after forming an encapsulation liner 40L, and a third interconnect dielectric layer 42. The encapsulation liner 40L is formed by deposition (e.g., CVD, PECVD, PVD, ALD or spin-on coating) of an encapsulation material (typically a dielectric material. In one embodiment, the encapsulation material is silicon nitride. In another embodiment, the encapsulation material is a dielectric material that contains atoms of silicon, carbon and hydrogen. In some embodiments, and in addition to atoms of carbon and hydrogen, the encapsulation material can include atoms of at least one of nitrogen and oxygen. In other embodiments, and in addition to atoms of silicon, nitrogen, carbon and hydrogen, the encapsulation material can include atoms of boron. In one example, the encapsulation liner 40L can be composed of an nBLOK dielectric material that contains atoms of silicon, carbon, hydrogen, nitrogen and oxygen. In alternative example, the encapsulation liner 40L can be composed of a SiBCN dielectric material that contains atoms of silicon, boron, carbon, hydrogen, and nitrogen. The encapsulation liner 40L can have a thickness from 10 nm to 200 nm. Other thicknesses are possible and can be employed as the thickness of the encapsulation liner 40L. The encapsulation liner 40L is formed on physically exposed surfaces of each SOT MRAM (See, FIG. 16A), and on the physically exposed surface of the spin conductor layer 22 and the I-shaped SOT channel 18C in the area in which contacts will be formed to the electrically conductive via structure 12 (See, FIG. 16B).

The third interconnect dielectric layer 42 includes one of the interconnect dielectric materials mentioned above for the first interconnect dielectric layer 10. The interconnect dielectric material that provides the third interconnect dielectric layer 42 can be compositionally the same as, as compositionally different from, the interconnect dielectric material that provides either the first interconnect dielectric layer 10 or the second interconnect dielectric layer 34. The third interconnect dielectric layer 42 can be formed utilizing one of the deposition processes mentioned above in forming the first interconnect dielectric layer 10. A planarization process such as, for example, CMP, can follow the deposition of the interconnect dielectric material that provides the third interconnect dielectric layer 42.

Figure 17A:
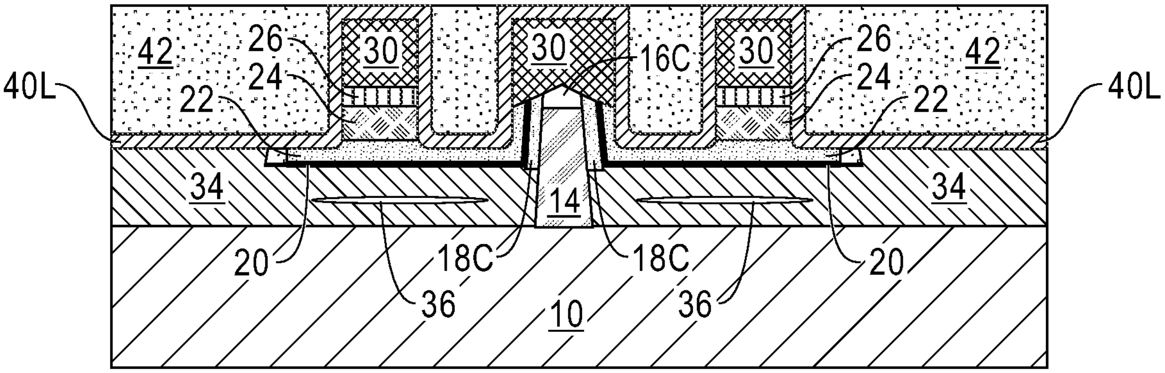
FIGS. 17A and 17B are cross sectional view of the exemplary BEOL structure shown in FIGS. 16A and 16B, respectively, after forming a first contact structure that contacts a surface of the electrically conductive via structure embedded in the first interlayer dielectric layer.
Figure 17B:
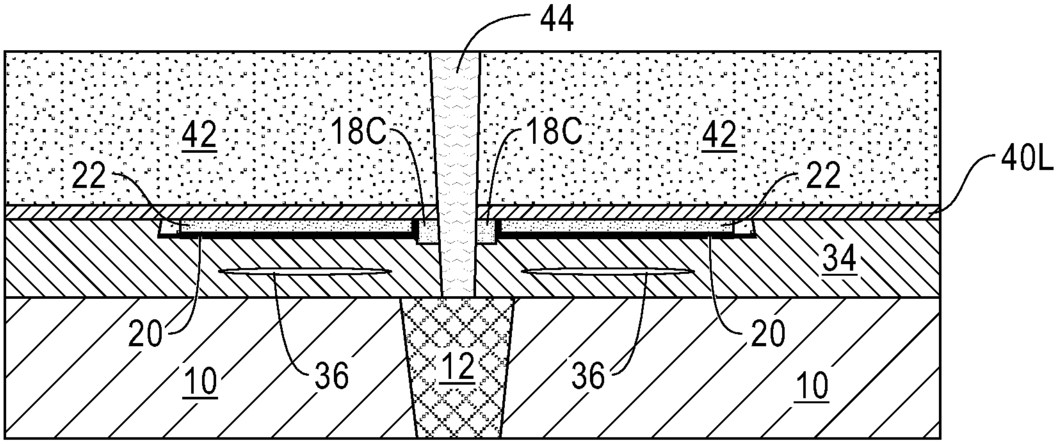

Referring now to FIGS. 17A and 17B, there are illustrated the exemplary BEOL structure shown in FIGS. 16A and 16B, respectively, after forming a first contact structure 44 that contacts a surface of the electrically conductive via structure 12 embedded in the first interlayer dielectric layer 10. The first contact structure 44 is formed by a forming a contact opening that physically exposes a surface of the electrically conductive via structure 12. The contact opening is formed by lithography and etching. The etching removes portions of the third interconnect dielectric layer 42, the encapsulation liner 40L and the second interconnect dielectric layer 34, while removing an entirety of the dielectric pillar 14 that remains on the electrically conductive via structure 12. The contact opening is then filled (via a deposition process) with at least one of the electrically conductive materials mentioned above for the electrically conductive via structure 12. A diffusion barrier material can be formed along the sidewalls of the contact opening prior to filling the contact opening with an electrically conductive material. A planarization process such as, for example, CMP, follows the filling of the contact opening. The resultant first contact structure 44 passes through the third interconnect dielectric layer 42, the encapsulation liner 40L and the second interconnect dielectric layer 34 and the first contact structure 44 is in direct contact with a sidewall of each of the spin conductor charge insulator layer 20 and the I-shaped SOT channel 18C.

Figure 18A:
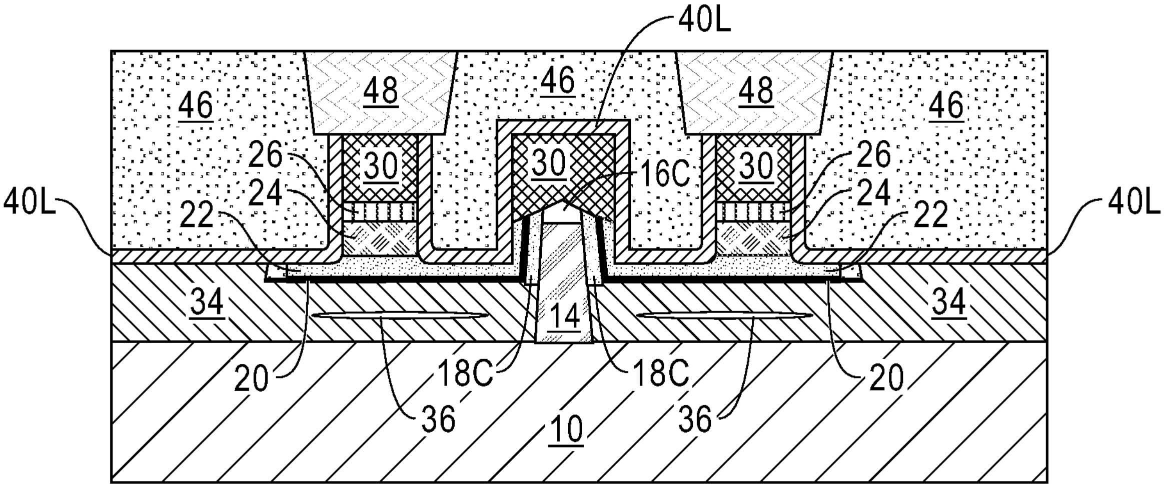
FIGS. 18A and 18B are cross sectional view of the exemplary BEOL structure shown in FIGS. 17A and 17B, respectively, after forming additional interconnect dielectric material on the third interconnect dielectric layer and forming second contact structures, each second contact structure contacts a MRAM electrode-containing hard mask of the SOT MRAMs.
Figure 18B:
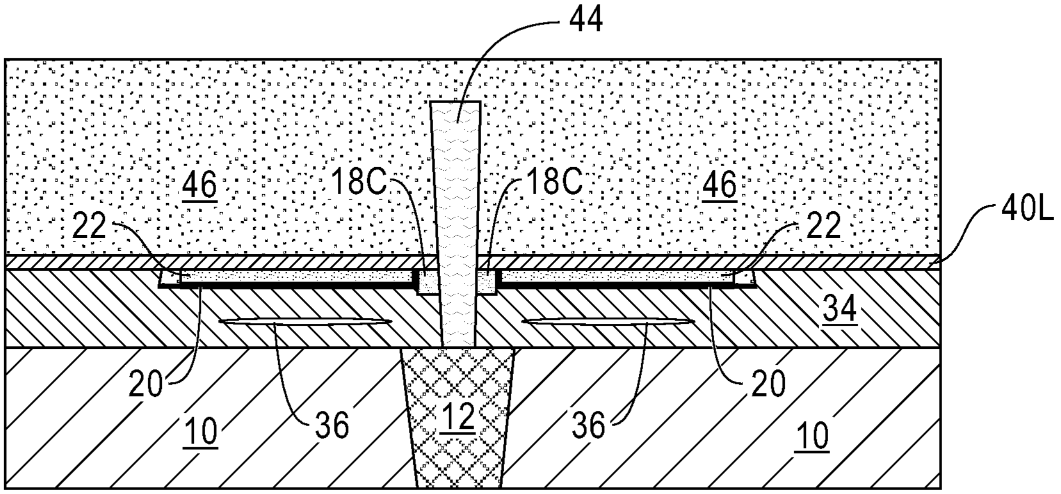

Referring now to FIGS. 18A and 18B, there are illustrated the exemplary BEOL structure shown in FIGS. 17A and 17B, respectively, after forming additional interconnect dielectric material on the third interconnect dielectric layer 42 and forming second contact structures 48, each second contact structure 48 contacts the MRAM electrode-containing hard mask 30 (e.g., an electrode) of the SOT MRAMs. Collectively the third interconnect dielectric layer 42 and the additional interconnect dielectric material provide an upper interconnect dielectric layer 46. The additional interconnect dielectric material includes one of the interconnect dielectric materials mentioned above for the first interconnect dielectric layer 10. The additional interconnect dielectric material can be compositionally the same as, as compositionally different from, the interconnect dielectric material that provides third interconnect dielectric layer 42. The additional interconnect dielectric material can be formed utilizing one of the deposition processes mentioned above in forming the first interconnect dielectric layer 10. A planarization process such as, for example, CMP, can follow the deposition of the additional interconnect dielectric material that provides the upper interconnect dielectric layer 46.

The second contact structures 48 are formed by forming contact openings that extend through the upper interconnect dielectric layer 46 and the encapsulation liner 40L that is located on top of the MRAM electrode-containing hard mask 30. The contacting openings can be formed by lithography and etching. The contact openings are then filled (via a deposition process) with at least one of the electrically conductive materials mentioned above for the electrically conductive via structure 12. A diffusion barrier material can be formed along the sidewalls of the contact openings prior to filling the contact openings with an electrically conductive material. A planarization process such as, for example, CMP, follows the filling of the contact openings providing second contact structures 48 as shown in FIG. 18A.

Notably, FIGS. 18A-18B illustrates a SOT MRAM structure in accordance with an embodiment of the present application; FIGS. 24, 34A-34C and 35 illustrate similar SOT MRAM structures as illustrated in FIGS. 18A-18B. The SOT MRAM structure includes spin conductor charge insulator layer 20 having a horizontal portion and a vertical portion, and spin conductor layer 22 contacting the horizontal portion of the spin conductor charge insulator layer 20 and a first sidewall of the vertical portion of the spin conductor charge insulator layer 20. The SOT MRAM structure further includes MTJ structure 24 including a magnetic free layer, a magnetic tunnel barrier layer, and a magnetic reference layer in which the magnetic free layer is in direct physical contact with the spin conductor layer 22. The SOT MRAM structure further includes a MTJ cap 26 contacting the MTJ structure 24, a MRAM electrode-containing hard mask 30 contacting the MTJ cap 26 and an I-shaped SOT channel 18C located on a second sidewall of the vertical portion of the spin conductor charge insulator layer 20 and having a bottommost surface that is vertically offset from a bottommost surface of the spin conductor charge insulator layer 20, the second sidewall is opposite the first sidewall. In the SOT MRAM structure, an interface between each of the spin conductor charge insulator layer, the spin conductor layer, the I-shaped SOT channel, the MTJ structure and the MTJ cap is a pure material interface. The SOT MRAM structure further includes a dielectric pillar 14 located adjacent to, and in direct contact with, the I-shaped SOT channel 18C. The I-shaped SOT channel 18C enables perpendicular SOT memory cell structure. On key advantage of the SOT MRAM structure and the method described to form it, is the pure interface between the SOT channel 18C, spin conductor charge insulator 20, spin conductor 22 and MTJ structure 26, where all these layers have been deposited without vacuum break and not exposed to the ambient or any chemistry as a result of RIE or CMP. In other words, no chemistry such as O, C, N, F, Cl, etc., which will scatter the spin polarized electrons and negatively impact the device performance, can be detected between these critical interfaces which do not contain any of the elements listed above.

In embodiments of the present application (See, for example, FIGS. 18A-18B), the structure further includes first interconnect dielectric layer 10 located beneath the dielectric pillar 14 and second interconnect dielectric layer 34 located on the first dielectric layer 10 and beneath the spin conductor charge insulator layer 20, wherein an electrically conductive via structure 12 is present in the first interconnect dielectric layer 10.

In embodiments of the present application (See, for example, FIGS. 18A-18B), the structure further includes void 36 located in the second interconnect dielectric layer 34 that is beneath the spin conductor charge insulator layer 20.

In embodiments of the present application (See, for example, FIGS. 18A-18B), the structure further includes upper interconnect dielectric layer 46 embedding the MTJ structure 24, the MTJ cap 26 and the MRAM electrode-containing hard mask 30.

In embodiments of the present application (See, for example, FIGS. 18A-18B), the structure further includes first contact structure 44 and second contact structure 48 in the upper interconnect dielectric layer 46, in which the first contact structure 44 contacts the electrically conductive via structure 12 and the second contact structure 48 contacts the MRAM electrode-containing hard mask 30. The memory cell's write current is applied through the electrically conductive via structure 12 and first contact structure 44 to the I-shaped SOT channel 18C, to generate perpendicular spin. Second contact structure 48 is used to read the state of the memory cell by passing a read current through the MTJ.

In some embodiments of the present application (See, for example, FIGS. 18A-18B), the structure further includes another MRAM electrode-containing hard mask 30 located on top of the dielectric pillar 14 and the I-shaped SOT channel 18C, in which a dielectric cap 16C is located between the another MRAM electrode-containing hard mask and the dielectric pillar. This enables a two-MTJ memory cell structure, where a single write current can write the left and right MTJs in opposite directions, which can be useful for certain applications.

In some embodiments of the present application (See, for example, FIGS. 24 and 34A), the structure further includes a shunting metal structure 54 located on a topmost surface of the I-shaped SOT channel 18C.

In some embodiments of the present application (See, for example, FIGS. 34A and 35) the spin conductor charge insulator layer 20 and the spin conductor layer 22 are bounded on one side by the dielectric pillar 14 and on the other side by another dielectric pillar 14. These dielectric pillars 14 help with stability of the structure after undercutting of blanket layer of SOT material.

Figure 19:
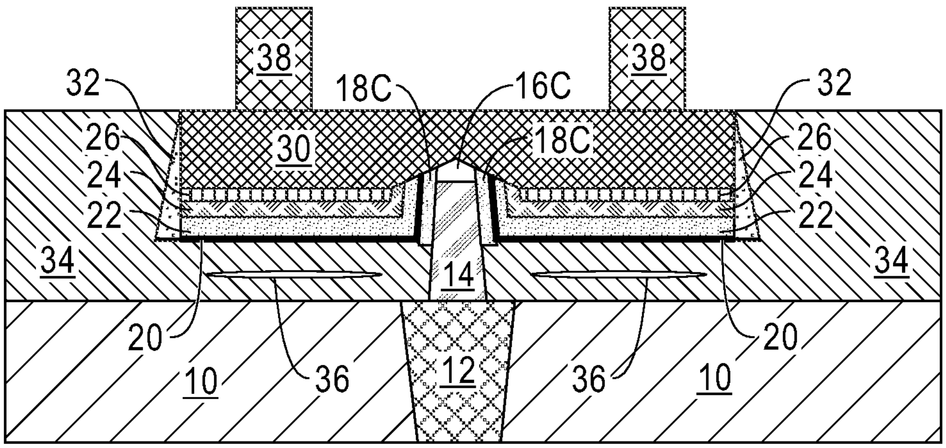
FIG. 19 is a cross sectional view of the exemplary BEOL structure shown in FIG. 13 after forming patterned masks on the remaining portion of the blanket layer of MRAM electrode-containing hard mask material in accordance with another embodiment of the present application.

Referring now to FIG. 19, there is illustrated the exemplary BEOL structure shown in FIG. 13 after forming patterned masks 38 on MRAM electrode-containing hard mask 30 in accordance with an alternative embodiment of the present application. Note that the cut B-B is not shown for this alternative embodiment since it would like the same as in the previous embodiment of the present application. In this alternative embodiment, no patterned mask 38 is formed on top of the dielectric pillar 14. The patterned mask 38 used for this embodiment is the same as described above in the previous embodiment of the present application.

Figure 20:
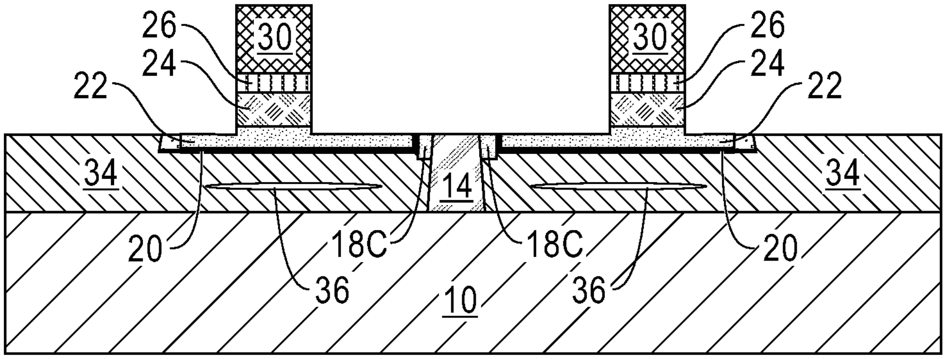
FIG. 20 is a cross sectional view of the exemplary BEOL structure shown in FIG. 19 after performing an MTJ patterning process, the MTJ patterning process forms SOT MRAMs.

Referring now to FIG. 20, there is illustrated the exemplary BEOL structure shown in FIG. 19 after performing an MTJ patterning process, the MTJ patterning process forms SOT MRAMs. The MTJ patterning process of this embodiment is the same as that previously described above except that in the alternative process the MTJ patterning process removes the dielectric cap 16C and an upper portion of the dielectric pillar 16 and eliminates the formation of a vertical component for the spin conductor layer 22. In this alternative embodiment, each SOT MRAM includes MRAM electrode-containing hard mask 30 (as a top electrode), MTJ cap 26, MTJ structure 24, spin conductor layer 22, spin conductor charge insulator layer 20 and I-shaped SOT channel 18C. As is shown, the spin conductor charge insulator layer 20 has a horizontal component beneath the MTJ structure 24 and a vertical component that is adjacent to a side wall of the remaining dielectric pillar 14.

Figure 21:
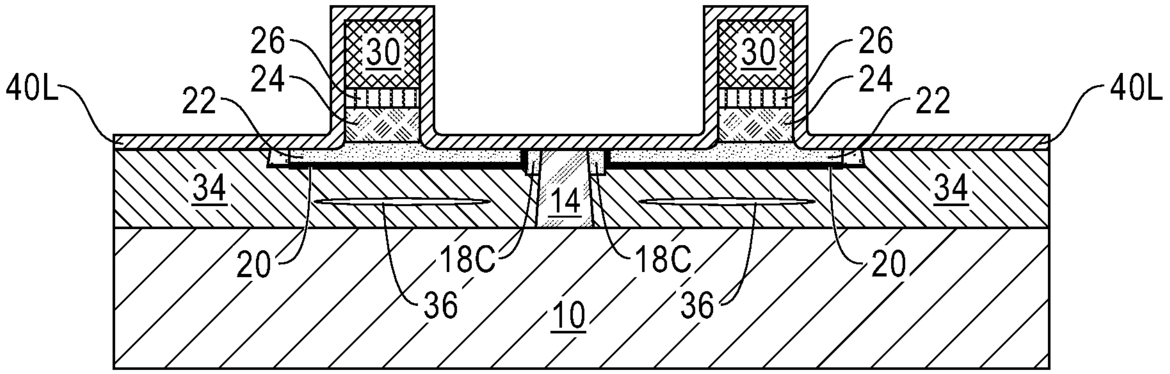
FIG. 21 is a cross sectional view of the exemplary BEOL structure of FIG. 20 after forming an encapsulation liner.

Referring now to FIG. 21, there is illustrated the exemplary BEOL structure of FIG. 20 after forming an encapsulation liner 40L. Encapsulation liner 40L used in the alternative embodiment is the same as the one described above for the previous embodiment of the present application.

Figure 22:
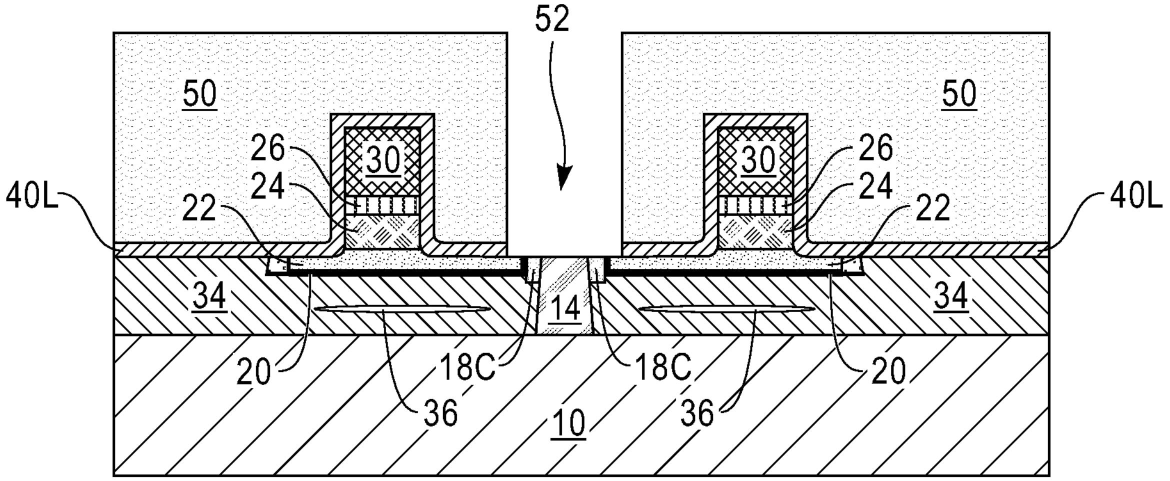
FIG. 22 is a cross sectional view of the exemplary BEOL structure of FIG. 21 after performing a shunting region patterning process.

Referring now to FIG. 22, there is illustrated the exemplary BEOL structure of FIG. 21 after performing a shunting region patterning process. The shunting region patterning process includes forming a patterned mask 50 protecting the SOT MRAMs. Patterned mask 50 includes any masking material including an organic planarization material. The patterned mask 50 has an opening that physically exposes an area in which shunting of neighboring SOT MRAMs is to be performed. The patterned mask 50 can be formed by deposition, lithography and etching. The shunting region patterning process further includes providing an opening 52 that extends through the encapsulation liner 40L and physically exposes the I-shaped SOT channel 18C and the remaining pillar 14. Opening 52 can be formed utilizing an etch that is selective for opening the encapsulation liner 40L.

Figure 23:
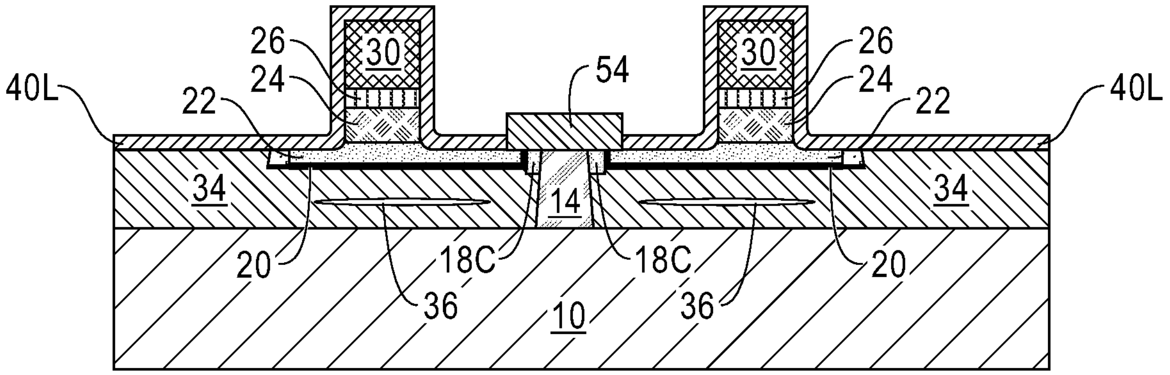
FIG. 23 is a cross sectional view of the exemplary BEOL structure of FIG. 22 after forming a shunting metal structure.

Referring now to FIG. 23, there is illustrated the exemplary BEOL structure of FIG. 22 after forming a shunting metal structure 54 and removing the patterned mask 50. The shunting metal structure 54 is formed by forming a shunting metal into the opening 52 by deposition and a recess etch. After the recess etch, the patterned mask 50 is removed utilizing any conventional material removal process. The shunting metal structure 54 can be composed of Ti, TiN, Ta, TaN, W, Ru, Rd, Co, Cu, Al, or any metallic alloys of the mentioned or other metals. The shunting metal structure 54 provides a bridge between the I-shaped SOT channels 18C of the neighboring SOT MRAMs as well as forming a path for the read current of the memory cells.

Figure 24:
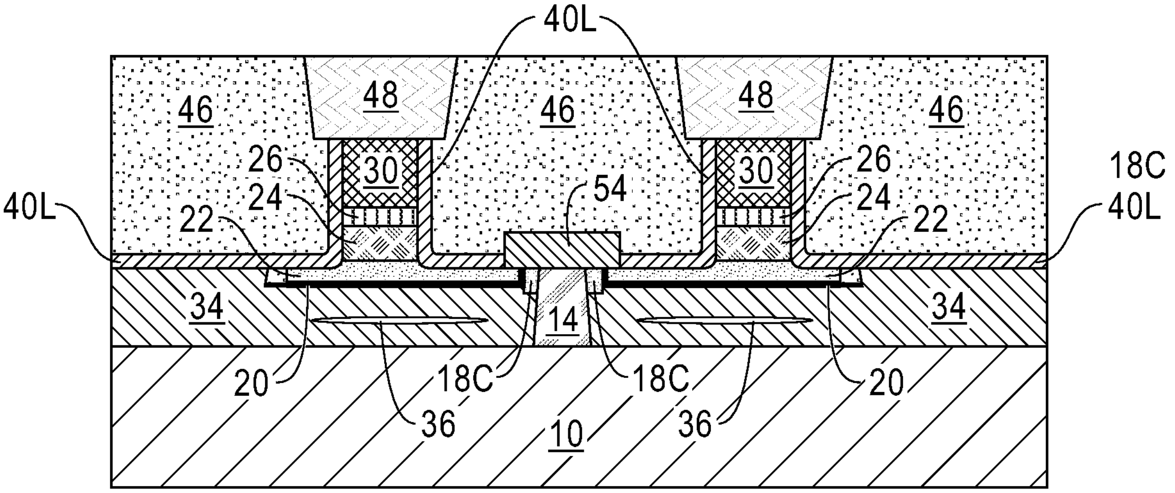
FIG. 24 is a cross sectional view of the exemplary BEOL structure of FIG. 23 after forming an upper interconnect dielectric layer and second contact structures in the upper interconnect dielectric layer, each second contact structure contacts a MRAM electrode of the SOT MRAMs.

Referring now to FIG. 24, there is illustrated the exemplary BEOL structure of FIG. 23 after forming an upper interconnect dielectric layer 46 and second contact structures 48 in the upper interconnect dielectric layer 46, each second contact structure 48 contacts a MRAM electrode of the SOT MRAMs. The illustrated structure shown in FIG. 24 is formed utilizing the materials and process streps mentioned in FIG. 17A-18B above. Notably, the illustrated structure shown in FIG. 24 is formed by first forming the third interconnect dielectric layer 42 on the structure shown in FIG. 23. After forming the third interconnect dielectric layer, the region including the electrically conductive via structure 12 is processed as described above to include the first contact structure 44 (thus the structure shown in FIG. 24 would be adjacent to the region including the electrically conductive via structure 12 having the first contact structure 44 (See, for example, FIG. 17B). Additional interconnect dielectric material is then formed on the third interconnect dielectric layer 42 providing upper interconnect dielectric layer 46, and thereafter the second contact structures 48 as formed providing the structure shown in FIG. 24.

Notably, FIG. 24 (as well as FIGS. 34A-34C to follow) illustrates a memory structure that includes a first SOT MRAM (left hand side of the drawing) and a second SOT MRAM (right hand side of the drawing), each of the first SOT MRAM and the second SOT MRAM includes spin conductor charge insulator layer 20 having a horizontal portion and a vertical portion, spin conductor layer 22 contacting the horizontal portion of the spin conductor charge insulator layer 20 and a first sidewall of the vertical portion of the spin conductor charge insulator layer 20, MTJ structure 24 including a magnetic free layer, a magnetic tunnel barrier layer, and a magnetic reference layer in which the magnetic free layer is in direct physical contact with the spin conductor layer 22, MTJ cap 26 contacting the MTJ structure 24, MRAM electrode-containing hard mask 30 contacting the MTJ cap 26, and I-shaped SOT channel 18C located on a second sidewall of the vertical portion of the spin conductor charge insulator layer 20 and having a bottommost surface that is vertically offset from a bottommost surface of the spin conductor charge insulator layer 20, wherein the second sidewall is opposite the first sidewall, and a dielectric pillar 14 located adjacent to, and in direct contact with, the I-shaped SOT channel. 18C. In the memory structure, an interface between each of the spin conductor charge insulator layer, the spin conductor layer, the I-shaped SOT channel, the MTJ structure and the MTJ cap is a pure material interface. The memory structure further includes a metal shunting structure 54 contacting a topmost surface of the I-shaped SOT channel 18C of both the first SOT MRAM and the second SOT MRAM, and located on top of the dielectric pillar 14.

In embodiments of the present application (See, for example, FIG. 24 and FIGS. 34A-34C to follow), the structure further includes first interconnect dielectric layer 10 located beneath the dielectric pillar 14 and second interconnect dielectric layer 34 located on the first dielectric layer 10 and beneath the spin conductor charge insulator layer 20 of both the first SOT MRAM and the second SOT MRAM, wherein an electrically conductive via structure 12 is present in the first interconnect dielectric layer 10.

In some embodiments of the present application (See, for example, FIG. 24 and FIGS. 34A-34C to follow), the structure further includes void 36 located in the second interconnect dielectric layer 34 that is beneath the spin conductor charge insulator layer 20 of both the first SOT MRAM and the second SOT MRAM.

In some embodiments of the present application (See, for example, FIG. 24 and FIGS. 34A-34C to follow), the structure further include upper interconnect dielectric layer 46 embedding the MTJ structure 24, the MTJ cap 26 and the MRAM electrode-containing hard mask 30 of both the first SOT MRAM and the second SOT MRAM.

In some embodiments of the present application (See, for example, FIG. 24 and FIGS. 34A-34C to follow), the structure further include first contact structure 44 and second contact structures 48 in the upper interconnect dielectric layer 46, wherein the first contact structure 44 contacts the electrically conductive via structure 12 and one of the second contact structures 48 contacts the MRAM electrode-containing hard mask 30 of the first SOT MRAM and another of the second contact structures 48 contacts the MRAM-electrode containing hard mask 30 of the second SOT MRAM. The memory cell's write current is applied through via 12 and contact 44 to the SOT channel 18C, to generate perpendicular spin. Second contact structure 48 is used to read the state of the memory cell by passing a read current through the MTJ.

In embodiments of the present application (See, for example, FIG. 24), the metal shunting structure 54 contacts both the spin conductor charge insulator layer 20 and the spin conductor layer 22.

Figure 25A:
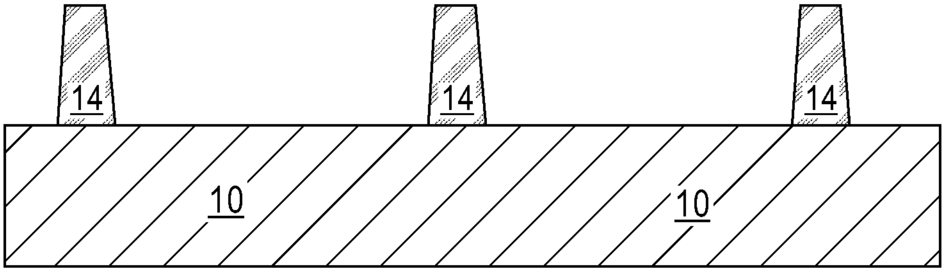
FIGS. 25A and 25B are cross sectional views of another exemplary BEOL structure through cut A-A and B-B of FIG. 1 respectively, that can be employed in accordance with an embodiment of the present application, the exemplary BEOL structure includes a first interconnect dielectric layer, an electrically conductive via structure embedded in the first interlayer dielectric layer and a plurality of dielectric pillars.
Figure 25B:
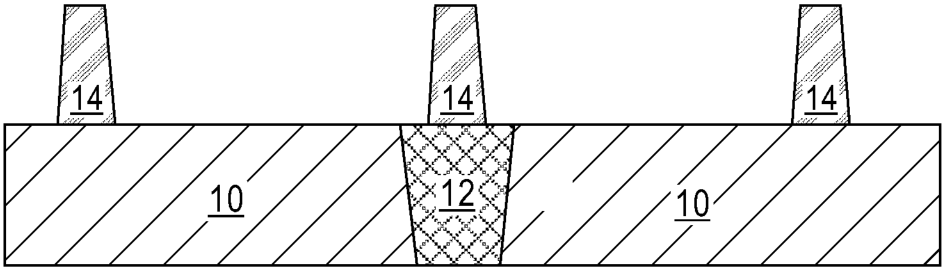

Referring now to FIGS. 25A and 25B, there are illustrated another exemplary BEOL structure through cut A-A and B-B of FIG. 1 respectively, that can be employed in accordance with an embodiment of the present application. The exemplary BEOL structure illustrated in FIGS. 25A and 25B includes first interconnect dielectric layer 10, electrically conductive via structure 12 embedded in the first interlayer dielectric layer 10 and a plurality of interconnect dielectric pillars 14. The first interconnect dielectric layer 10, the electrically conductive via structure 12, and the dielectric pillars 14 of this embodiment include materials as mentioned above for the exemplary BEOL structure illustrated in FIGS. 2A-2B. The exemplary BEOL structure illustrated in FIGS. 25A and 25B can be formed utilizing the same processing techniques mentioned above in forming the exemplary BEOL structure illustrated in FIGS. 2A and 2B. In the exemplary BEOL structure illustrated in FIGS. 25A and 25B, dielectric pillars 14 are formed along cut A-A and those dielectric pillars along cut A-A serve as anchoring structures and provide more stability during the subsequent removal of the sacrificial dielectric material from the exemplary BEOL structure illustrated in FIGS. 25A and 25B.

Figure 26A:
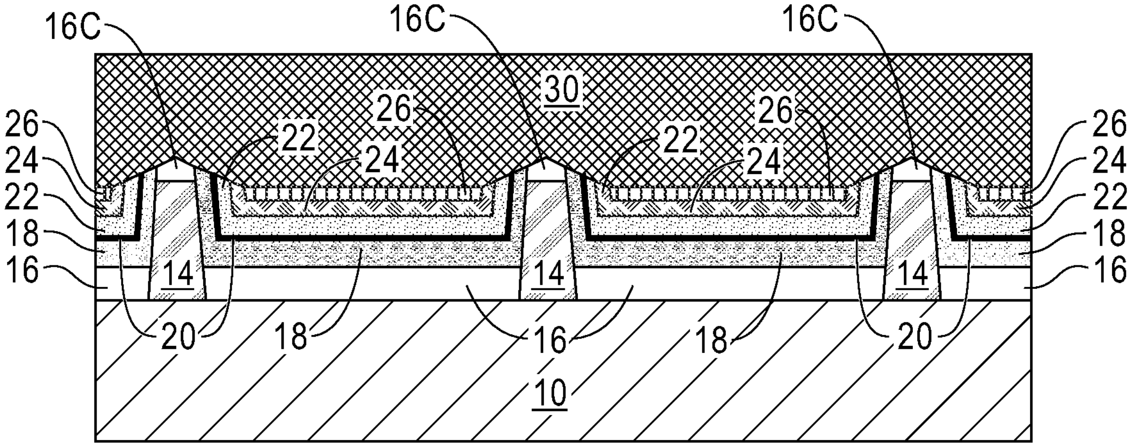
FIGS. 26A and 26B are cross sectional views of the exemplary BEOL structure shown in FIGS. 25A and 25B, respectively, after performing the processing steps illustrated in FIGS. 3A-8B thereon.
Figure 26B:
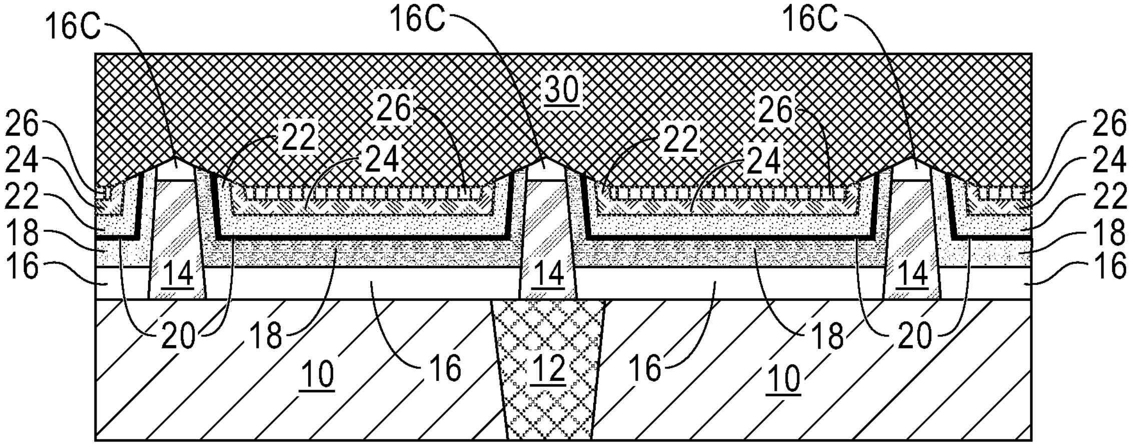
Figure 26C:
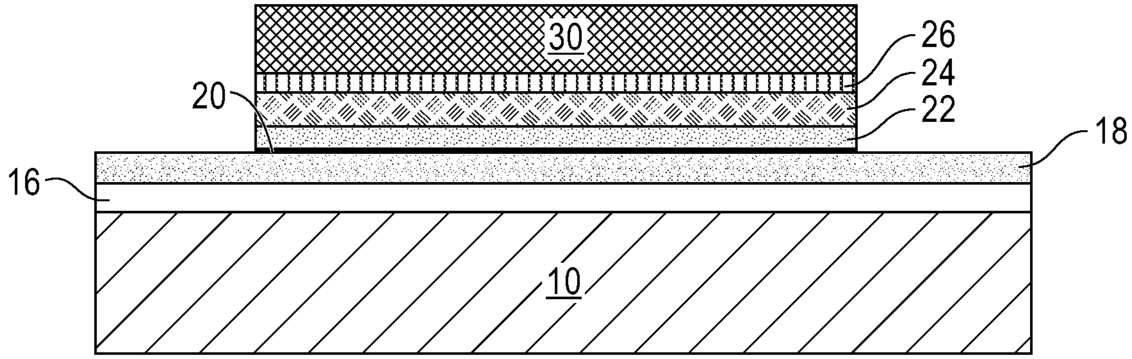
FIG. 26C is a cross sectional view of the exemplary BEOL structure shown in FIGS. 26A and 26B, respectively, and through cut C-C of FIG. 1.

Referring now to FIGS. 26A and 26B, there are illustrated the exemplary BEOL structure shown in FIGS. 25A and 25B, respectively, after performing the processing steps illustrated in FIGS. 3A-8B thereon. FIG. 26C is also provided that illustrates the exemplary BEOL structure shown in FIGS. 26A and 26B, respectively, and through cut C-C of FIG. 1. Notably, the exemplary BEOL structure shown in FIGS. 25A and 25B is subjected to processing steps that include: (i) forming the blanket layer of dielectric material 16L on physically exposed surfaces of the first interconnect dielectric layer 10, the electrically conductive via structure 12 and each dielectric pillar 14; (ii), removing the blanket layer of dielectric material 16L from the sidewall of the interconnect dielectric pillars 14, while maintaining a first portion of the blanket layer of dielectric material (i.e., sacrificial dielectric layer 16) on the first interconnect dielectric layer 10, the electrically conductive via structure 12 and a second portion of the blanket layer of dielectric material (i.e., the dielectric cap 16C) on top of the dielectric pillars 14; (iii) forming a material stack of, from bottom to top, the blanket layer of SOT material 18L, the blanket layer of spin conductor charge insulator material 20L, the blanket layer of spin conductor material 22L, the blanket layers of MTJ materials 24L, the blanket layer of MTJ cap material 26L, and the blanket layer of sacrificial hard mask material 28; (iv) removing the material stack that is located on top of the dielectric cap 16C that is on top of the dielectric pillars 14; forming the blanket layer of MRAM electrode-containing hard mask material. 30L; and (v) patterning the blanket layer of MRAM electrode-containing hard mask material 30L and an upper portion of the remaining material stack. Each of processing steps (i)-(v) and materials used in those processing steps have been described in detail above with respect to FIGS. 3A-8B.

Figure 27A:
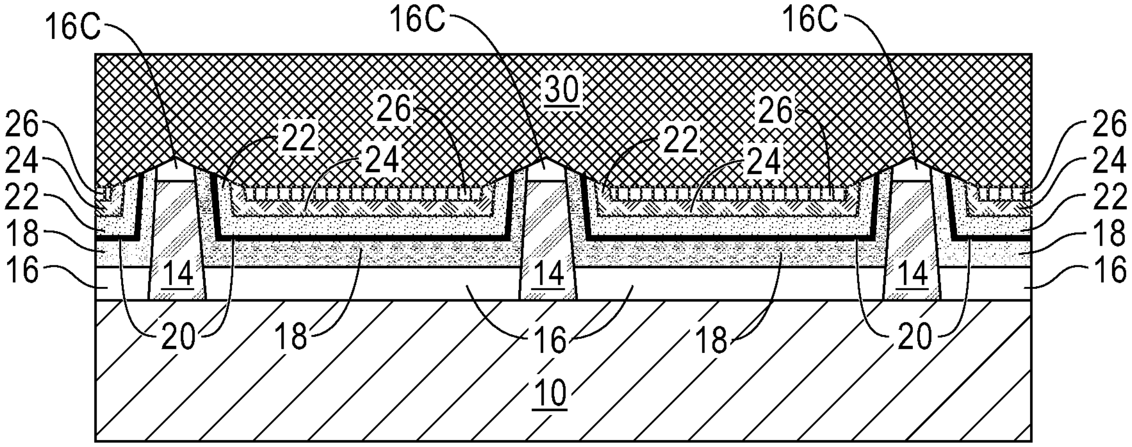
FIGS. 27A-27C are cross sectional views of the exemplary BEOL structure shown in FIGS. 26A-26C, respectively, after performing the processing steps of FIGS. 9A-10B thereon.
Figure 27B:
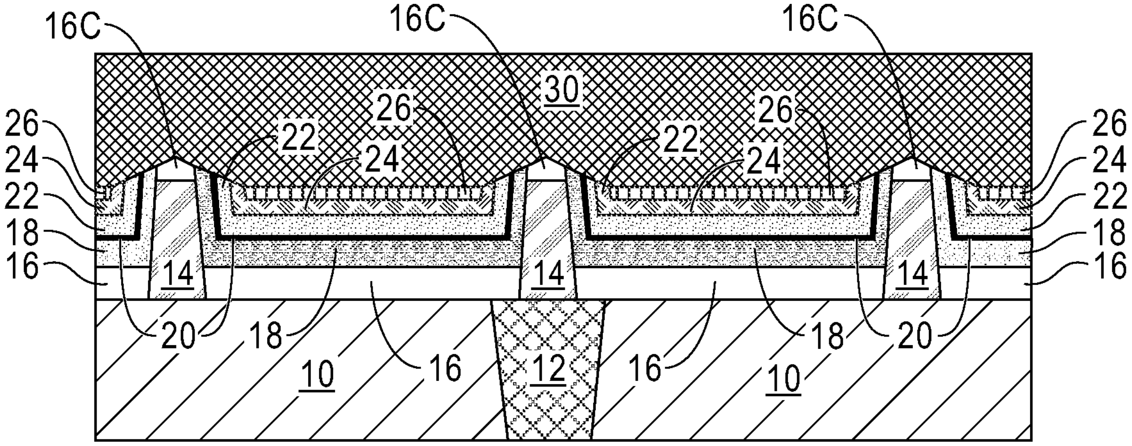
Figure 27C:
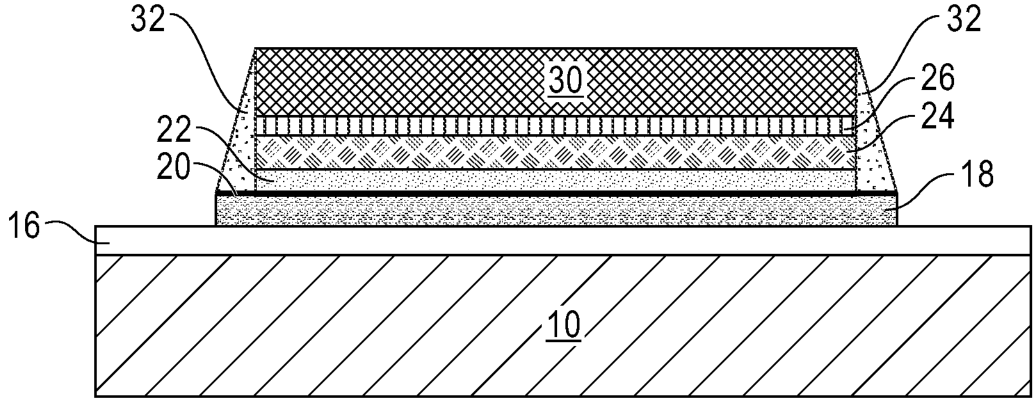

Referring now to FIGS. 27A-27C, there are the exemplary BEOL structure shown in FIGS. 26A-26C, respectively, after performing the processing steps of FIGS. 9A-10B thereon. Notably, the exemplary BEOL structure shown in FIGS. 26A and 26B is subjected to processing steps that include: (vi) forming dielectric spacer 32 along a sidewall of the MRAM electrode-containing hard mask 30 and a remaining portion of the upper portion of the material stack; and (vii) performing a directional etch to physically expose sacrificial dielectric layer 16. Each of processing steps (vi)-(vii) and materials used in those processing steps have been described in detail above with respect to FIGS. 9A-10B.

Figure 28A:
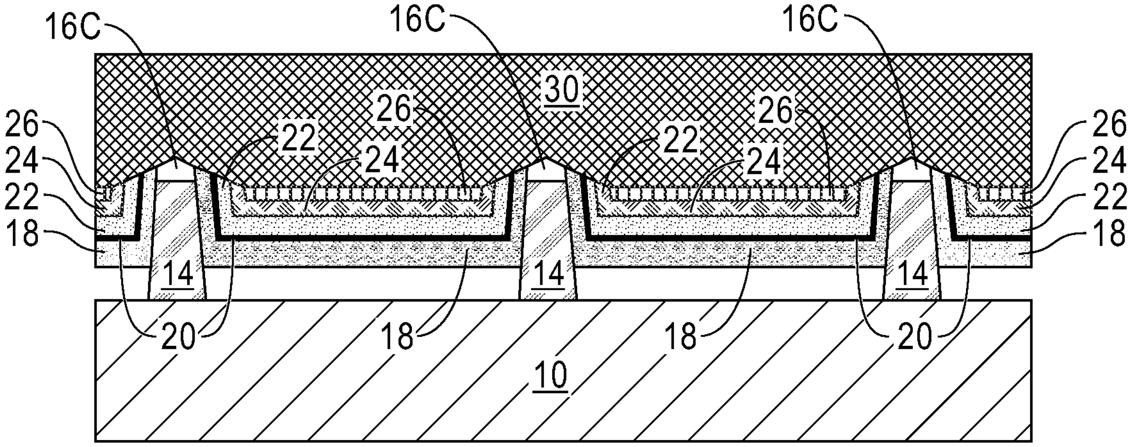
FIGS. 28A-28C are cross sectional views of the exemplary BEOL structure shown in FIGS. 27A-27C, respectively, after performing the processing step of FIGS. 11A-11B thereon.
Figure 28B:
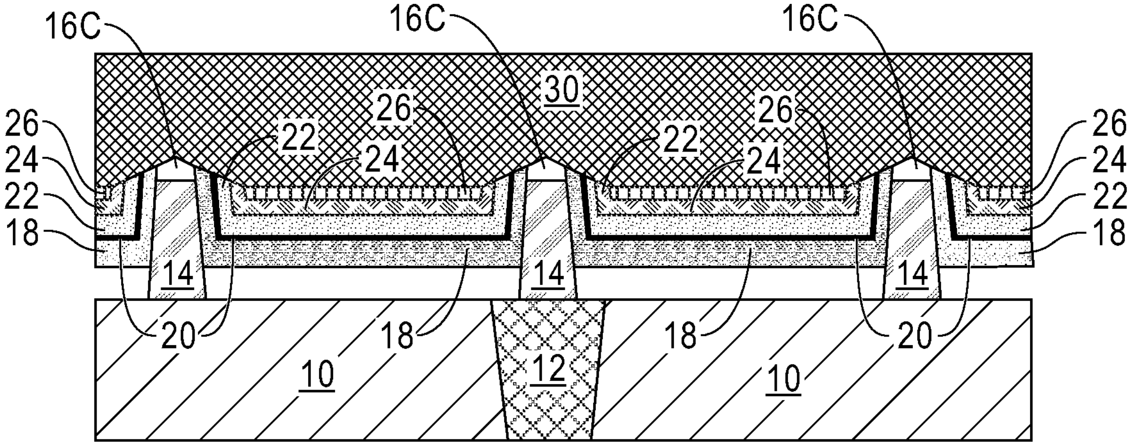
Figure 28C:
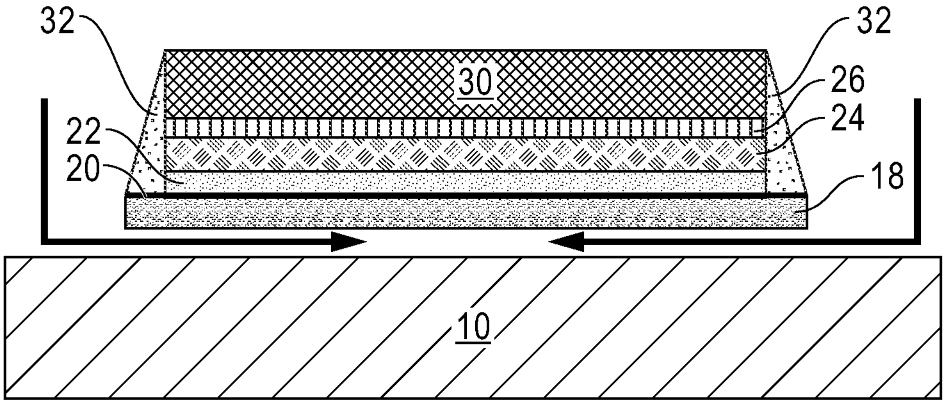

Referring now to FIGS. 28A-28C, there are illustrated the exemplary BEOL structure shown in FIGS. 27A-27C, respectively, after performing the processing step of FIGS. 11A-11B thereon. Notably, the exemplary BEOL structure shown in FIGS. 27A-27C is subjected a processing step (i.e., etch as described above for providing the exemplary BEOL structure shown in FIGS. 11A and 11B) that physically exposes a bottommost surface of the blanket layer of SOT material 18L by removing the physically exposed sacrificial dielectric layer 16.

Figure 29A:
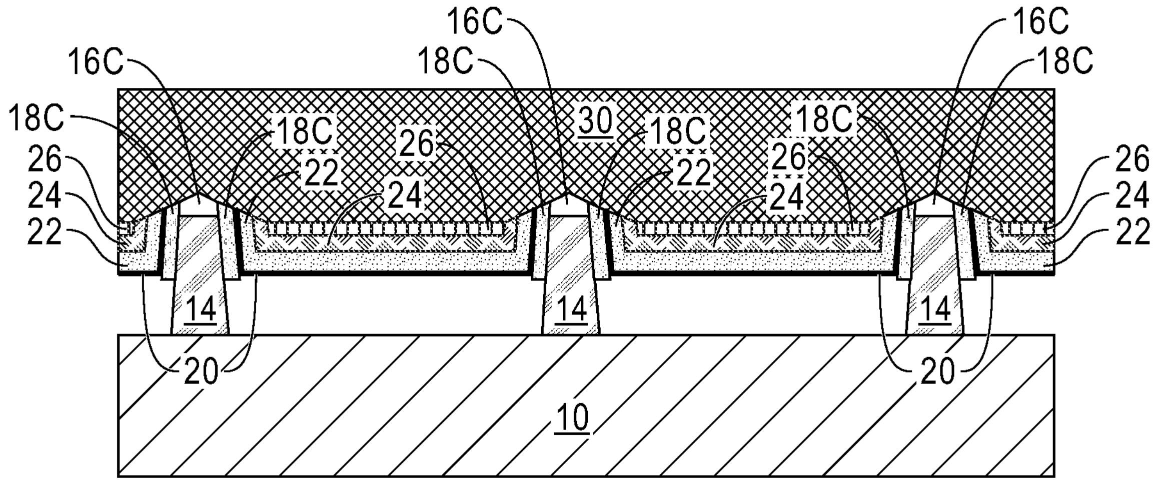
FIGS. 29A-29C are cross sectional views of the exemplary BEOL structure shown in FIGS. 28A-28C, respectively, after performing the processing step of FIGS. 12A-12B thereon.
Figure 29B:
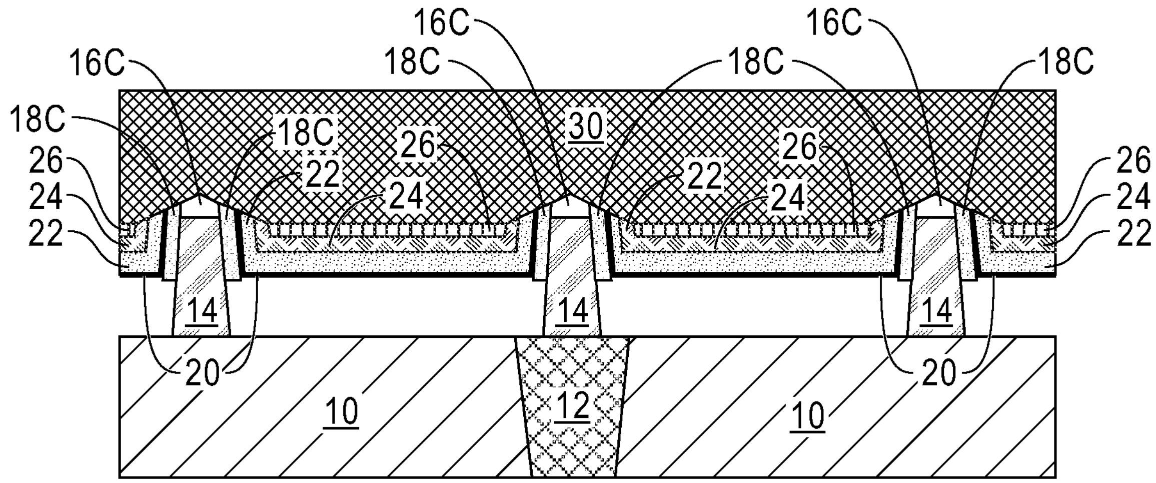
Figure 29C:
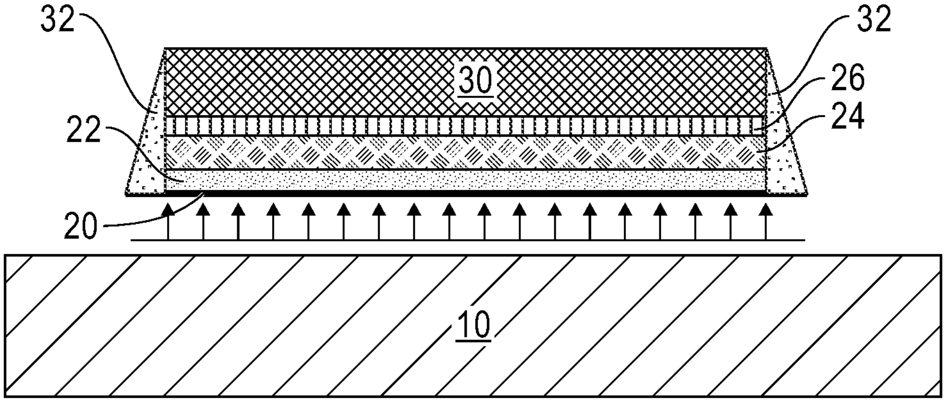

Referring now to FIGS. 29A-29C, there are illustrated the exemplary BEOL structure shown in FIGS. 28A-28C, respectively, after performing the processing step of FIGS. 12A-12B thereon. Notably, the exemplary BEOL structure shown in FIGS. 28A-28C is subjected a processing step (i.e., etch as described above for providing the exemplary BEOL structure shown in FIGS. 12A and 12B) that removes a horizontal component of the physically exposed blanket layer of SOT material 18L and physically exposed a bottommost surface of the spin conductor charge insulator layer 20.

Figure 30A:
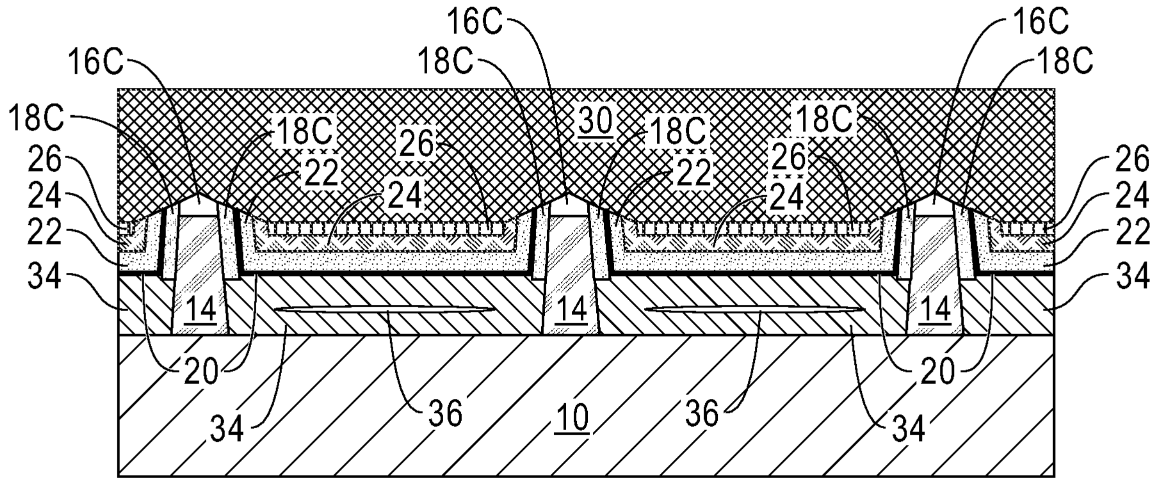
FIGS. 30A-30C are cross sectional views of the exemplary BEOL structure shown in FIGS. 29A-29C, respectively, after performing the processing step of FIGS. 13A-13B thereon.
Figure 30B:
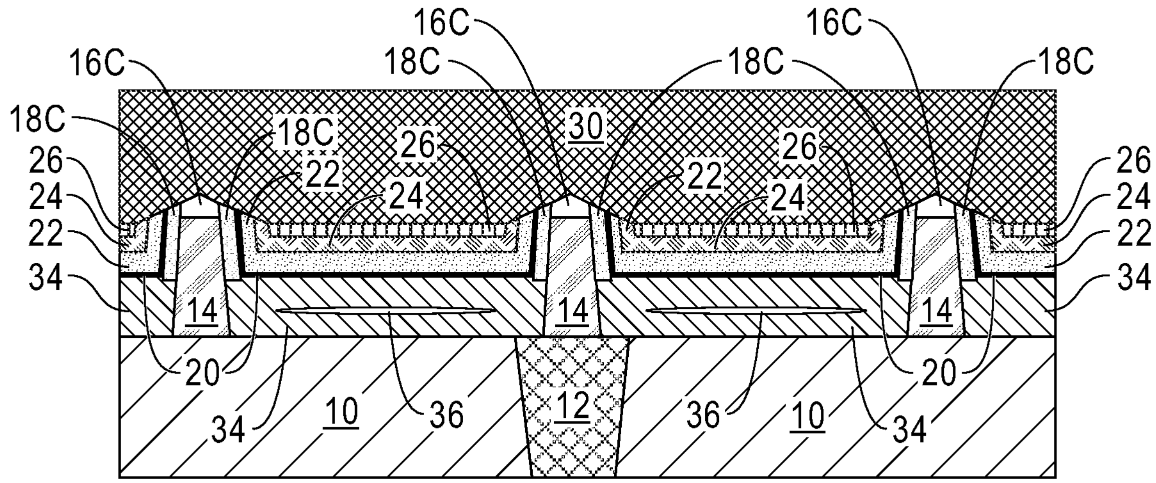
Figure 30C:
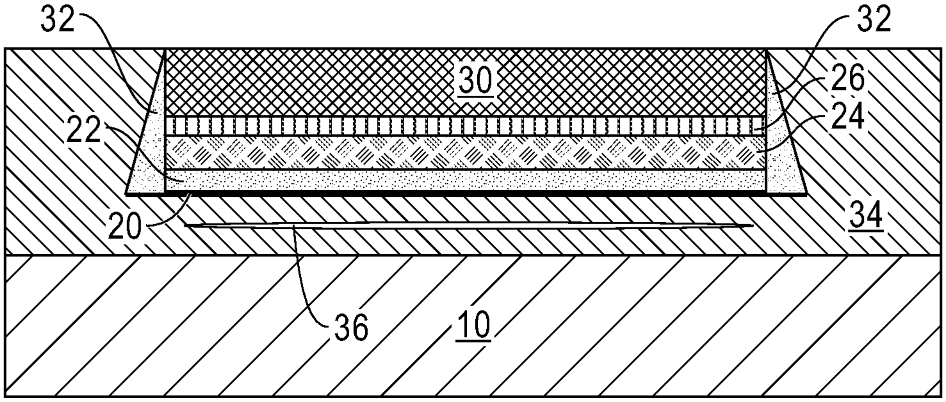

Referring now to FIGS. 30A-30C, there are illustrated the exemplary BEOL structure shown in FIGS. 29A-29C, respectively, after performing the processing step of FIGS. 13A-13B thereon. Notably, the exemplary BEOL structure shown in FIGS. 29A-29C is subjected a processing step that includes forming (via deposition and planarization) second interconnect dielectric layer 34. The second interconnect dielectric layer 34 can include voids 36.

Figure 31A:
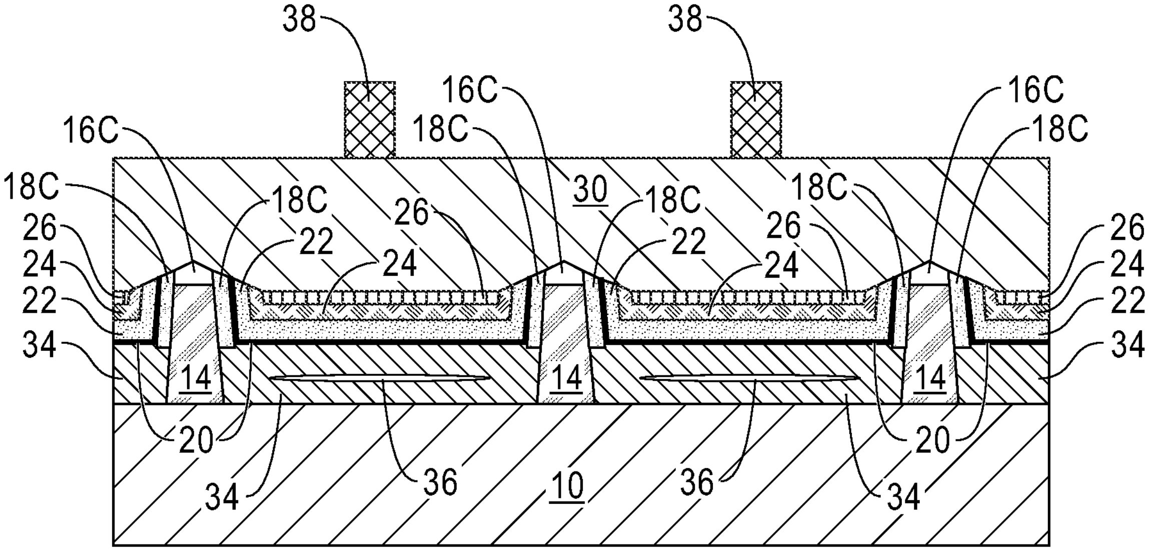
FIGS. 31A and 31B are cross sectional views of the exemplary BEOL structure shown in FIGS. 30A and 30B, respectively, after forming patterned masks on the remaining portion of the blanket layer of MRAM electrode-containing hard mask material.
Figure 31B:
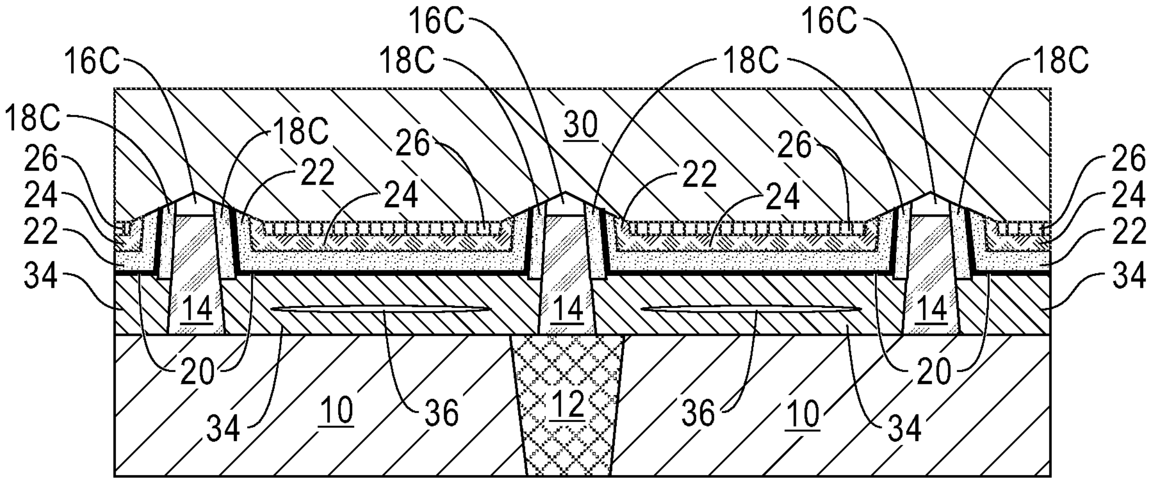

Referring now to FIGS. 31A and 31B, there are illustrated the exemplary BEOL structure shown in FIGS. 30A and 30B, respectively, after forming patterned masks 38 on MRAM electrode-containing hard mask 30. Patterned masks 38 are formed and include materials as defined above for forming the patterned mask 38 in the exemplary BEOL structure shown in FIG. 19.

Figure 32A:
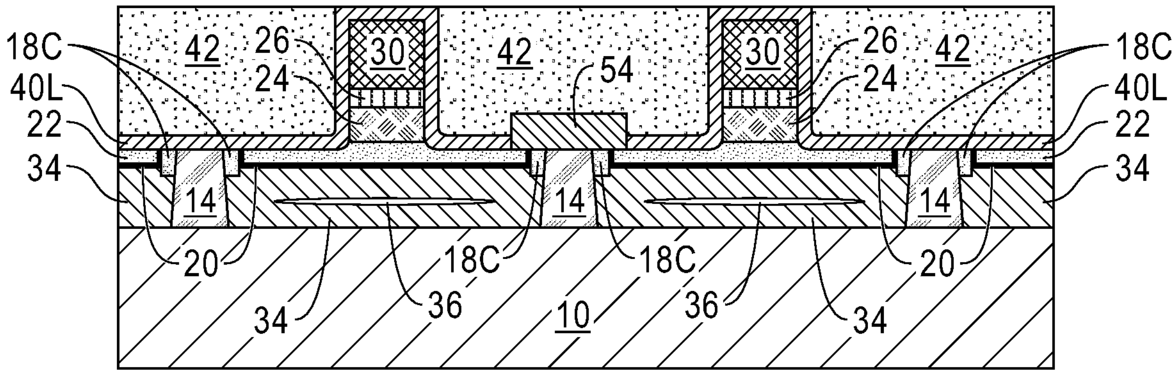
FIGS. 32A and 32B are cross sectional views of the exemplary BEOL structure shown in FIGS. 31A and 31B, respectively, after performing an MTJ patterning process, and forming an encapsulation liner, a shunting metal, and a third interconnect dielectric layer.
Figure 32B:
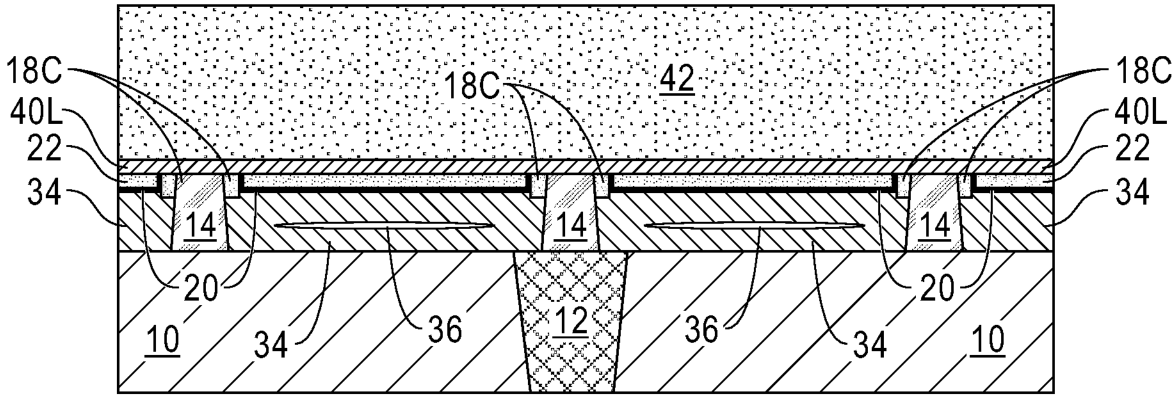

Referring now to FIGS. 32A and 32B, there are illustrated the exemplary BEOL structure shown in FIGS. 31A and 31B, respectively, after performing an MTJ patterning process (as previously described above), and forming encapsulation liner 40L (as previously described above), shunting metal 54 (as previously described above), and third interconnect dielectric layer 42 (as previously described above). Notably, the exemplary BEOL structure shown in FIGS. 31A-31C are subjected to the various processing steps mentioned above in FIG. 20 (MTJ patterning), FIG. 21 (encapsulation liner 40L formation), FIG. 22 (shunting area definition and opening), FIG. 23 (shunting metal 54 formation) and thereafter the third interconnect dielectric layer 42 is formed as described above for the other embodiments of the present application.

Figure 33A:
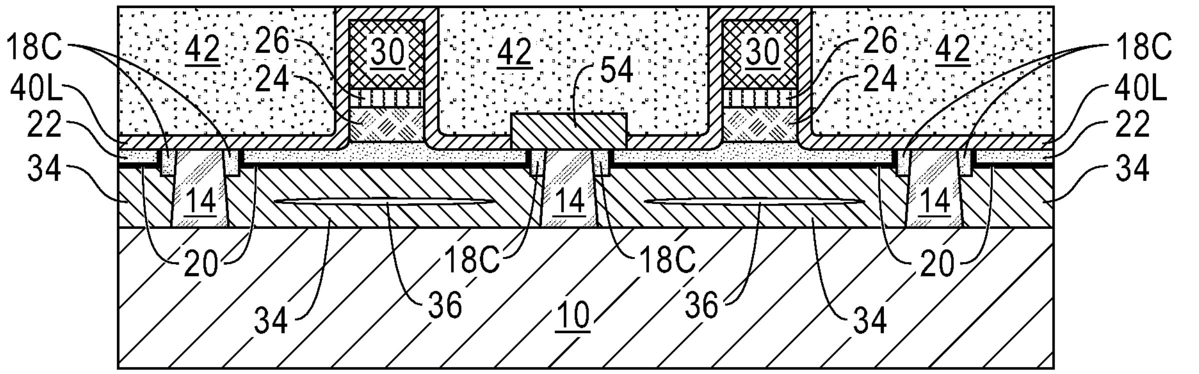
FIGS. 33A and 33B are cross sectional views of the exemplary BEOL structure shown in FIGS. 32A and 32B, respectively, after forming a first contact structure that contacts a surface of the electrically conductive via structure embedded in the first interlayer dielectric layer.
Figure 33B:
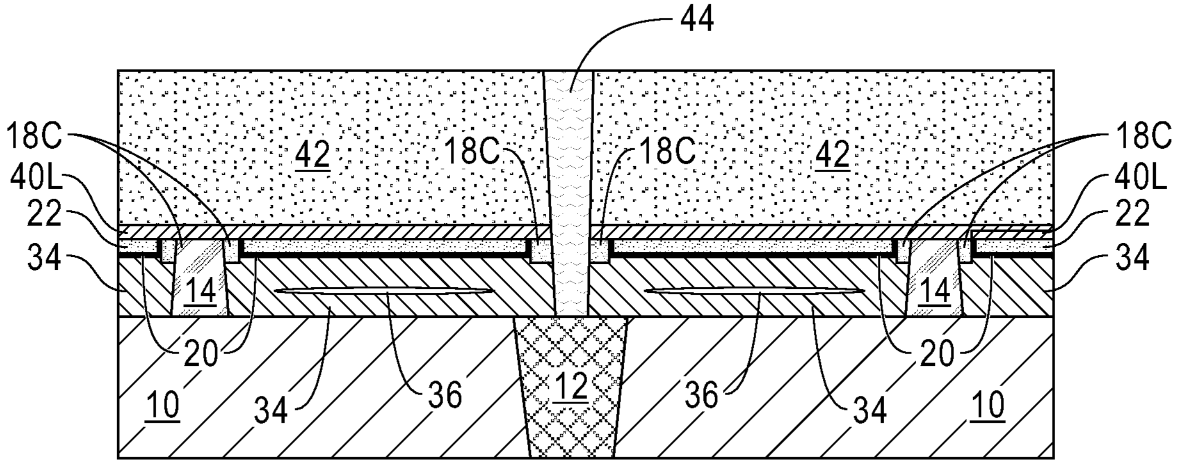

Referring now to FIGS. 33A and 33B, there are illustrated the exemplary BEOL structure shown in FIGS. 32A and 32B, respectively, after forming first contact structure 44 that contacts a surface of the electrically conductive via structure 12 embedded in the first interlayer dielectric layer 10. The first contact structure 44 of this embodiment is the same as the first contact structure 44 formed in FIG. 17B. Thus, the first contact structure 44 is formed using techniques and material as mentioned above in forming the first contact structure 44 shown in FIG. 17B.

Figure 34A:
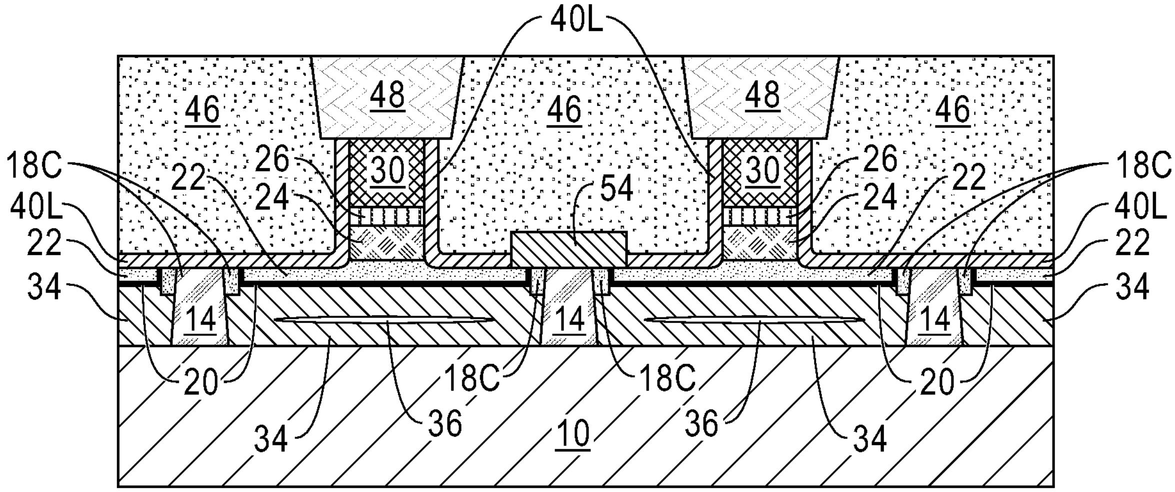
FIGS. 34A and 34B are cross sectional view of the exemplary BEOL structure shown in FIGS. 33A and 33B, respectively, after forming additional interconnect dielectric material on the third interconnect dielectric layer and forming second contact structures.
Figure 34B:
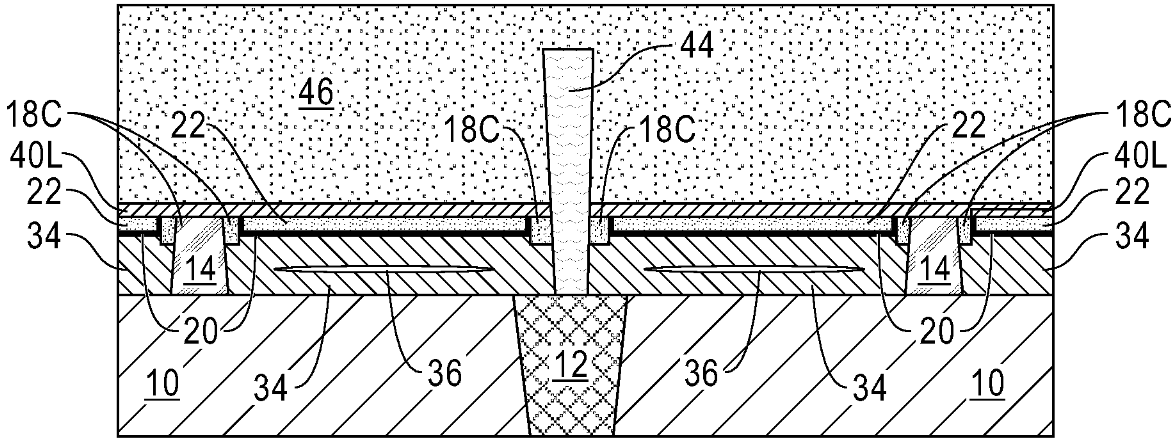
Figure 34C:
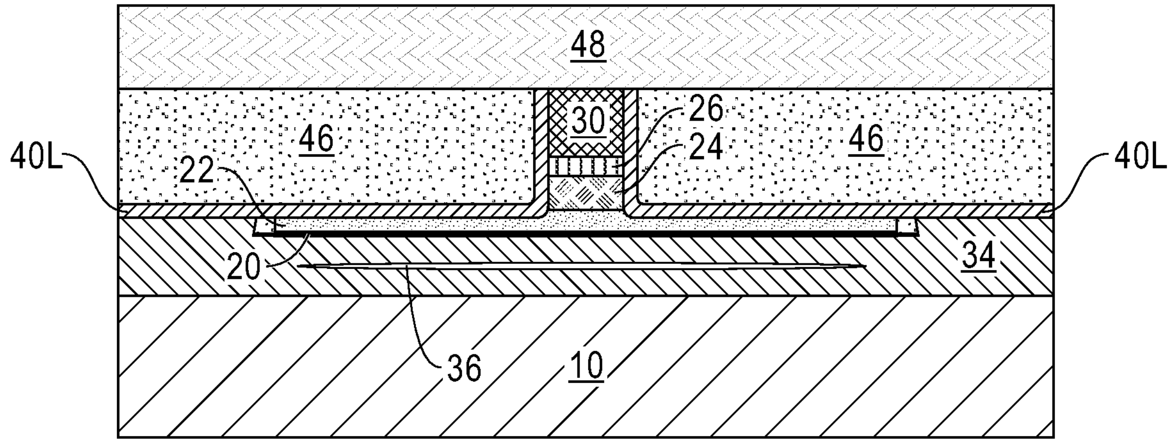
FIG. 34C is a cross sectional view of the exemplary BEOL structure shown in FIGS. 34A and 34B and through cut C-C of FIG. 1.

Referring now to FIGS. 34A and 34B, there are illustrated the exemplary BEOL structure shown in FIGS. 33A and 33B, respectively, after forming additional interconnect dielectric material on the third interconnect dielectric layer 42 (the additional interconnect dielectric material and the third interconnect dielectric layer 32 are collectively referred to as the upper interconnect dielectric layer 46 and forming second contact structures 48. FIG. 34C is also provided to show the exemplary BEOL structure shown in FIGS. 34A and 34B and through cut C-C of FIG. 1. Each of the additional interconnect dielectric material, and the second contact structure 48 can be formed utilizing materials and processing techniques mentioned above for forming the same elements in FIGS. 18A-18B.

Figure 35:
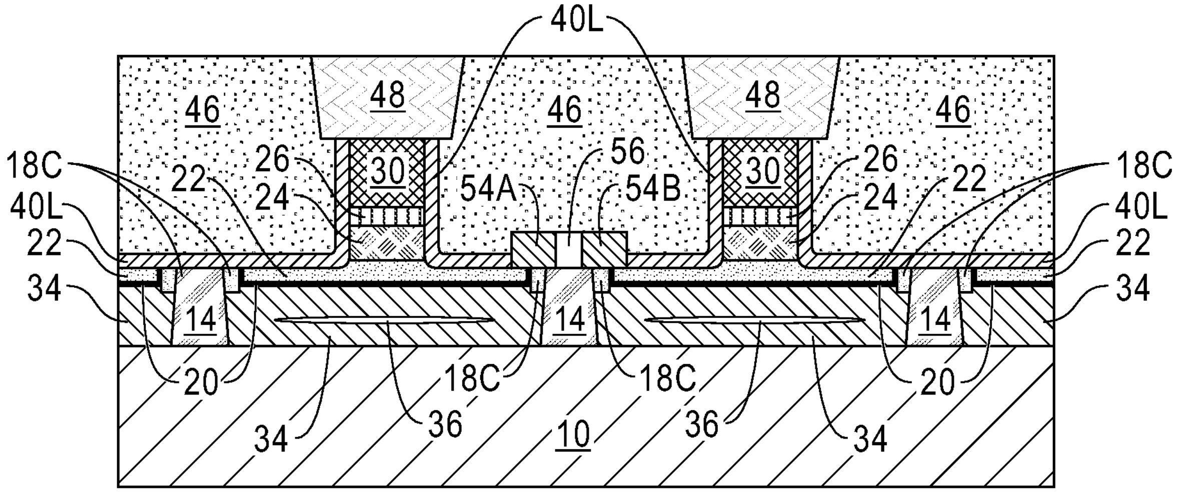
FIG. 35 is a cross sectional view of alternative SOT memory structure of the present application through cut A-A of FIG. 1.

Referring now to FIG. 35, there is illustrated a SOT memory structure of the present application. The SOT memory structure illustrated in FIG. 35 is essentially identical to the SOT memory structure illustrated in FIG. 34A except that in the shunting region of the structure the shunting metal 54 has been patterned into a first shunting metal structure 54A and a second shunting metal structure 54B, and a cell separating dielectric 56 is formed in a gap that is located between the first shunting metal structure 54A and the second shunting metal structure 54B. The SOT memory structure illustrated in FIG. 35 can be formed utilizing the same basic processing steps utilized in forming the SOT memory structure illustrated in FIG. 34A except that the shunting metal structure 54 is patterned by lithography and etching and thereafter the cell separating dielectric 56 is formed into the gap be deposition and a recess etch. The cell separating dielectric 56 can be composed of any dielectric material such as, for example, silicon dioxide, silicon nitride, silicon oxynitride or any combination thereof.

Notably, FIG. 35 illustrates a memory structure that includes a first SOT MRAM (left hand side of the drawing) and a second SOT MRAM (right hand side of the drawing), each of the first SOT MRAM and the second SOT MRAM includes spin conductor charge insulator layer 20 having a horizontal portion and a vertical portion, spin conductor layer 22 contacting the horizontal portion of the spin conductor charge insulator layer 20 and a first sidewall of the vertical portion of the spin conductor charge insulator layer 20, MTJ structure 24 including a magnetic free layer, a magnetic tunnel barrier layer, and a magnetic reference layer in which the magnetic free layer is in direct physical contact with the spin conductor layer 22, MTJ cap 26 contacting the MTJ structure 24, MRAM electrode-containing hard mask 30 contacting the MTJ cap 26, and I-shaped SOT channel 18C located on a second sidewall of the vertical portion of the spin conductor charge insulator layer 20 and having a bottommost surface that is vertically offset from a bottommost surface of the spin conductor charge insulator layer 20, wherein the second sidewall is opposite the first sidewall, and a dielectric pillar 14 located adjacent to, and in direct contact with, the I-shaped SOT channel. 18C. In the memory structure, an interface between each of the spin conductor charge insulator layer, the spin conductor layer, the I-shaped SOT channel, the MTJ structure and the MTJ cap is a pure material interface. The memory structure can further include a first metal shunting structure 54A contacting a topmost surface of the I-shaped SOT channel 18C of the first SOT MRAM, a second metal shunting structure 54B contacting a topmost surface of the I-shaped SOT channel 18C of the second SOT MRAM, and a cell separating dielectric 56 separating the first metal shunting structure 54A from the second metal shunting structure 54B and located above the dielectric pillar 14. This embodiment enables a single MTJ per memory cell.

In embodiments of the present application (See, for example, FIG. 35), the structure further includes first interconnect dielectric layer 10 located beneath the dielectric pillar 14 and second interconnect dielectric layer 34 located on the first dielectric layer 10 and beneath the spin conductor charge insulator layer 20 of both the first SOT MRAM and the second SOT MRAM, wherein an electrically conductive via structure 12 is present in the first interconnect dielectric layer 10.

In some embodiments of the present application (See, for example, FIG. 35), the structure further includes void 36 located in the second interconnect dielectric layer 34 that is beneath the spin conductor charge insulator layer 20 of both the first SOT MRAM and the second SOT MRAM.

In some embodiments of the present application (See, for example, FIG. 35), the structure further include upper interconnect dielectric layer 46 embedding the MTJ structure 24, the MTJ cap 26 and the MRAM electrode-containing hard mask 30 of both the first SOT MRAM and the second SOT MRAM In some embodiments of the present application (See, for example, FIG. 35), the structure further include first contact structure 44 and second contact structures 48 in the upper interconnect dielectric layer 46, wherein the first contact structure 44 contacts the electrically conductive via structure 12 and one of the second contact structures 48 contacts the MRAM electrode-containing hard mask 30 of the first SOT MRAM and another of the second contact structures 48 contacts the MRAM-electrode containing hard mask 30 of the second SOT MRAM. The memory cell's write current is applied through via 12 and contact 44 to the SOT channel

18C, to generate perpendicular spin. Contact structure 48 is used to read the state of the memory cell by passing a read current through the MTJ.

In embodiments of the present application, (See, for example, FIG. 35), the first metal shunting structure 54A contacts both the spin conductor charge insulator layer 20 and the spin conductor layer 22 of the first SOT MRAM and the second metal shunting structure 54B contacts both the spin conductor charge insulator layer 20 and the spin conductor layer 22 of the second SOT MRAM.

Figure 36:
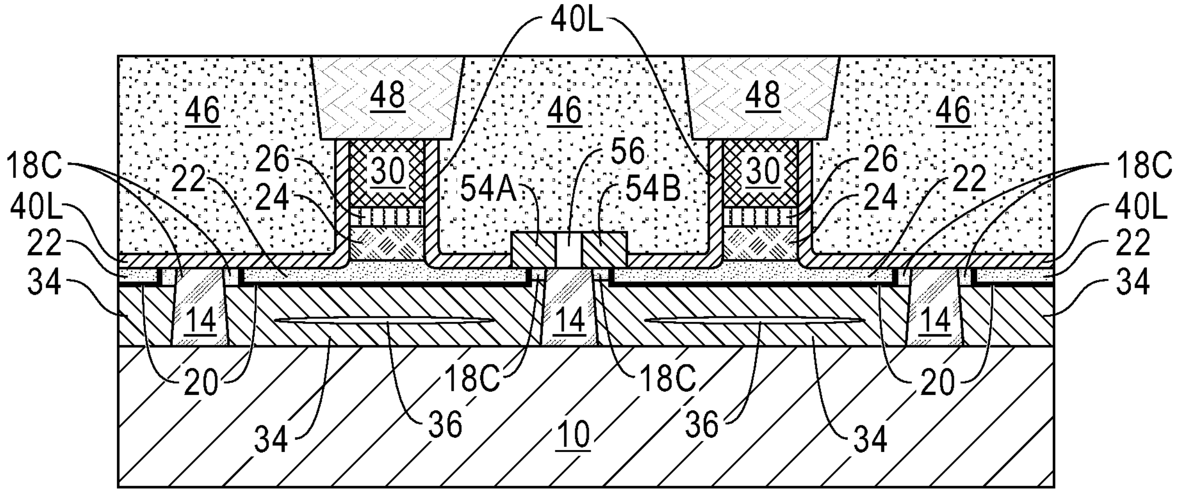
FIG. 36 is a cross sectional view of alternative SOT memory structure of the present application through cut A-A of FIG. 1.

Referring now to FIG. 36, there is illustrated an alternative memory structure in which the I-shaped SOT channel 18C has a bottommost surface that is positioned above a bottommost surface of the spin conductor charge insulator layer 20 In all the other embodiments of the present application (See, for example, FIGS. 18A-18B, 24 and 35), the I-shaped SOT channel 18C has a bottommost surface that is positioned below a bottommost surface of the spin conductor charge insulator layer 20. In the present application, the structures illustrated in FIGS. 18A-18B and 24 can be altered such that as a bottommost surface that is positioned above a bottommost surface of the spin conductor charge insulator layer 20. FIG. 36 represents an altering of the position of the I-shaped SOT channel 18C in the memory structure illustrated in FIG. 35. The structure illustrated in FIG. 36 can be formed utilizing the processing steps as described herein.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A spin-orbit torque magnetic random access memory (SOT MRAM) structure comprising:

a spin conductor charge insulator layer having a horizontal portion and a vertical portion;

a spin conductor layer contacting the horizontal portion of the spin conductor charge insulator layer and a first sidewall of the vertical portion of the spin conductor charge insulator layer;

a MTJ structure comprising a magnetic free layer, a magnetic tunnel barrier layer, and a magnetic reference, wherein the magnetic free layer is in direct physical contact with the spin conductor layer;

a MTJ cap contacting the MTJ structure;

a MRAM electrode-containing hard mask contacting the MTJ cap;

an I-shaped SOT channel located on a second sidewall of the vertical portion of the spin conductor charge insulator layer and having a bottommost surface that is vertically offset from a bottommost surface of the spin conductor charge insulator layer, wherein the second sidewall is opposite the first sidewall, wherein an interface between each of the spin conductor charge insulator layer, the spin conductor layer, the I-shaped SOT channel, the MTJ structure and the MTJ cap is a pure material interface; and a dielectric pillar located adjacent to, and in direct contact with, the I-shaped SOT channel.

2. The SOT MRAM structure of claim 1, further comprising a first interconnect dielectric layer located beneath the dielectric pillar and a second interconnect dielectric layer located on the first dielectric layer and beneath the spin conductor charge insulator layer, wherein an electrically conductive via structure is present in the first interconnect dielectric layer.

3. The SOR MRAM structure of claim 2, further comprising a void located in the second interconnect dielectric layer that is beneath the spin conductor charge insulator layer.

4. The SOT MRAM structure of claim 2, further comprising an upper interconnect dielectric layer embedding the MTJ structure, the MTJ cap and the MRAM electrode-containing hard mask.

5. The SOT MRAM structure of claim 3, further comprising a first contact structure and a second contact structure in the upper interconnect dielectric layer, wherein the first contact structure contacts the electrically conductive via structure and the second contact structure contact the MRAM electrode-containing hard mask.

6. The SOT MRAM structure of claim 1, further comprising another MRAM electrode-containing hard mask located on top of the dielectric pillar and the I-shaped SOT channel, wherein a dielectric cap is located between the another MRAM electrode-containing hard mask and the dielectric pillar.

7. The SOT MRAM structure of claim 1, a shunting metal structure located on a topmost surface of the I-shaped SOT channel.

8. The SOT MRAM structure of claim 1, wherein the spin conductor charge insulator layer and the spin conductor layer are bounded on one side by the dielectric pillar and on another side by another dielectric pillar.

9. A memory structure comprising a first spin-orbit torque magnetic random access memory (SOT MRAM) and a second SOT MRAM, each of the first SOT MRAM and the second SOT MRAM comprising a spin conductor charge insulator layer having a horizontal portion and a vertical portion, a spin conductor layer contacting the horizontal portion of the spin conductor charge insulator layer and a first sidewall of the vertical portion of the spin conductor charge insulator layer, a MTJ structure comprising a magnetic free layer, a magnetic tunnel barrier layer, and a magnetic reference, wherein the magnetic free layer is in direct physical contact with the spin conductor layer, a MTJ cap contacting the MTJ structure, a MRAM electrode-containing hard mask contacting the MTJ cap, and an I-shaped SOT channel located on a second sidewall of the vertical portion of the spin conductor charge insulator layer and having a bottommost surface that is vertically offset from a bottommost surface of the spin conductor charge insulator layer, wherein the second sidewall is opposite the first sidewall, and a dielectric pillar located adjacent to, and in direct contact with, the I-shaped SOT channel, wherein an interface between each of the spin conductor charge insulator layer, the spin conductor layer, the I-shaped SOT channel, the MTJ structure and the MTJ cap is a pure material interface; and a metal shunting structure contacting a topmost surface of the I-shaped SOT channel of both the first SOT MRAM and the second SOT MRAM, and located on top of the dielectric pillar.

10. The memory structure of claim 9, further comprising a first interconnect dielectric layer located beneath the dielectric pillar and a second interconnect dielectric layer located on the first dielectric layer and beneath the spin conductor charge insulator layer of both the first SOT MRAM and the second SOT MRAM, wherein an electrically conductive via structure is present in the first interconnect dielectric layer.

11. The memory structure of claim 10, further comprising a void located in the second interconnect dielectric layer that is beneath the spin conductor charge insulator layer of both the first SOT MRAM and the second SOT MRAM.

12. The memory structure of claim 10, further comprising an upper interconnect dielectric layer embedding the MTJ structure, the MTJ cap and the MRAM electrode-containing hard mask of both the first SOT MRAM and the second SOT MRAM.

13. The memory structure of claim 12, further comprising a first contact structure and second contact structures in the upper interconnect dielectric layer, wherein the first contact structure contacts the electrically conductive via structure and one of the second contact structures contact the MRAM electrode-containing hard mask of the first SOT MRAM and another of the second contact structures contacts the MRAM-electrode containing hard mask of the second SOT MRAM.

14. The memory structure of claim 10, wherein the metal shunting structure contacts both the spin conductor charge insulator layer and the spin conductor layer.

15. A memory structure comprising a first spin-orbit torque magnetic random access memory (SOT MRAM) and a second SOT MRAM, each of the first SOT MRAM and the second SOT MRAM comprising a spin conductor charge insulator layer having a horizontal portion and a vertical portion, a spin conductor layer contacting the horizontal portion of the spin conductor charge insulator layer and a first sidewall of the vertical portion of the spin conductor charge insulator layer, a MTJ structure comprising a magnetic free layer, a magnetic tunnel barrier layer, and a magnetic reference, wherein the magnetic free layer is in direct physical contact with the spin conductor layer, a MTJ cap contacting the MTJ structure, a MRAM electrode-containing hard mask contacting the MTJ cap, and an I-shaped SOT channel located on a second sidewall of the vertical portion of the spin conductor charge insulator layer and having a bottommost surface that is vertically offset from a bottommost surface of the spin conductor charge insulator layer, wherein the second sidewall is opposite the first sidewall, and dielectric pillar located adjacent to, and in direct contact with, the I-shaped SOT channel, wherein an interface between each of the spin conductor charge insulator layer, the spin conductor layer, the I-shaped SOT channel, the MTJ structure and the MTJ cap is a pure material interface;

a first metal shunting structure contacting a topmost surface of the I-shaped SOT channel of the first SOT MRAM;

a second metal shunting structure contacting a topmost surface of the I-shaped SOT channel of the second SOT MRAM; and a cell separating dielectric separating the first metal shunting structure from the second metal shunting structure and located above the dielectric pillar.

16. The memory structure of claim 15, further comprising a first interconnect dielectric layer located beneath the dielectric pillar and a second interconnect dielectric layer located on the first dielectric layer and beneath the spin conductor charge insulator layer of both the first SOT MRAM and the second SOT MRAM, wherein an electrically conductive via structure is present in the first interconnect dielectric layer.

17. The memory structure of claim 16, further comprising a void located in the second interconnect dielectric layer that is beneath the spin conductor charge insulator layer of both the first SOT MRAM and the second SOT MRAM.

18. The memory structure of claim 16, further comprising an upper interconnect dielectric layer embedding the MTJ structure, the MTJ cap and the MRAM electrode-containing hard mask of both the first SOT MRAM and the second SOT MRAM.

19. The memory structure of claim 18, further comprising a first contact structure and second contact structures in the upper interconnect dielectric layer, wherein the first contact structure contacts the electrically conductive via structure and one of the second contact structures contact the MRAM electrode-containing hard mask of the first SOT MRAM and another of the second contact structures contacts the MRAM-electrode containing hard mask of the second SOT MRAM.

20. The memory structure of claim 15, wherein first metal shunting structure contacts both the spin conductor charge insulator layer and the spin conductor layer of the first SOT MRAM, and the second metal shunting structure contacts both the spin conductor charge insulator layer and the spin conductor layer of the second SOT MRAM.

* * * * *